(12) United States Patent
Dumm et al.

(10) Patent No.: US 8,652,226 B2
(45) Date of Patent: Feb. 18, 2014

(54) ABRASIVE PARTICLES HAVING A UNIQUE MORPHOLOGY

(75) Inventors: Timothy Francis Dumm, Worthington, OH (US); Kan-Yin Ng, Columbus, OH (US)

(73) Assignee: Diamond Innovations, Inc., Worthington, OH (US)

(*) Notice: Subject to any disclaimer, the term of this patent is extended or adjusted under 35 U.S.C. 154(b) by 1075 days.

(21) Appl. No.: 12/560,899

(22) Filed: Sep. 16, 2009

(65) Prior Publication Data
US 2010/0068974 A1   Mar. 18, 2010

Related U.S. Application Data

(60) Provisional application No. 61/097,422, filed on Sep. 16, 2008, provisional application No. 61/187,789, filed on Jun. 17, 2009.

(51) Int. Cl.
| | |
|---|---|
| B24D 3/02 | (2006.01) |
| C09C 1/68 | (2006.01) |
| C09K 3/14 | (2006.01) |
| B24D 3/00 | (2006.01) |
| B24D 11/00 | (2006.01) |
| B24D 18/00 | (2006.01) |

(52) U.S. Cl.
USPC ................................. 51/307; 51/309; 51/293

(58) Field of Classification Search
USPC .................... 51/293, 295, 307, 309
See application file for complete search history.

(56) References Cited

U.S. PATENT DOCUMENTS

| 4,036,937 A | 7/1977 | Roy et al. |
| 4,062,660 A * | 12/1977 | Nicholas et al. ............... 51/295 |
| 4,122,636 A | 10/1978 | Roy et al. |
| 4,805,586 A | 2/1989 | Borse |
| 4,997,686 A | 3/1991 | Feldstein et al. |
| 5,035,771 A * | 7/1991 | Borse ............................. 216/81 |
| 5,145,517 A | 9/1992 | Feldstein et al. |
| 6,280,489 B1 | 8/2001 | Horie et al. |

(Continued)

FOREIGN PATENT DOCUMENTS

| JP | 08-209360 | * | 8/1996 | ............. C23C 28/02 |
| TW | 200831407 A | | 4/2008 | |
| WO | 2005011914 A2 | | 2/2005 | |
| ZA | 20020522 | | 4/2003 | |

OTHER PUBLICATIONS

Sonin et al., The action of iron particles at catalylzed hydrogenation of {100} and {110} faces of synthetic diamond, Diamond and Related Materials, vol. 12 (2003) 1559-1562, Elsevier.

(Continued)

*Primary Examiner* — Shuangyi Abu Ali
(74) *Attorney, Agent, or Firm* — Frank Gao, Esq

(57) ABSTRACT

An abrasive particle having an irregular surface, wherein the surface roughness of the particle is less than about 0.95. A method for producing modified abrasive particles, including providing a plurality of abrasive particles, providing a reactive coating on said particles, heating said coated particles; and recovering modified abrasive particles.

6 Claims, 23 Drawing Sheets

(56) References Cited

U.S. PATENT DOCUMENTS

| | | | |
|---|---|---|---|
| 6,565,618 B1 * | 5/2003 | Ishizuka | 51/307 |
| 7,377,477 B2 | 5/2008 | Lucek et al. | |
| 7,556,558 B2 | 7/2009 | Palmgren | |
| 7,562,858 B2 | 7/2009 | Dumm et al. | |
| 8,118,898 B2 | 2/2012 | Wakamiya | |
| 2004/0112867 A1 | 6/2004 | Horie et al. | |
| 2006/0246275 A1 | 11/2006 | Dumm et al. | |
| 2009/0064983 A1 | 3/2009 | Sudarshan | |

OTHER PUBLICATIONS

Sonin, Interaction of Fine Fe Particles with Structural Defects on {111} Faces of Snythetic Diamond Crystals in a Hydrogen Atmosphere, Inorganic Materials, vol. 40, No. 1, 2004, pp. 20-22.

Chepurov, The channeling action of iron particles in the catalyzed hydrogenation of synthetic diamond, Diamond and Related Materials, vol. 9, (2000), pp. 1435-1438.

Evans, T. et al., Etching of Diamond Surfaces with Gases, Philisophical Magazine, vol. 6, 1961, pp. 429-440.

* cited by examiner

FIG. 2

Physical and Performance Data for 4-8um Diamond Powder

| Sample | Weight Loss, % | Powder Mean Size, um | Specific Surface Area m²/gram | Material Removal, mg/hr | Clemex, Roughness | Clemex, Sphericity |
|---|---|---|---|---|---|---|
| 825C 30% Nickel (DOE #40) | 35 | 5.6 | 1.29 | 279 | 0.77 | 0.47 |
| 900C 30% Nickel (DOE#9) | 56 | 5.0 | 1.55 | 304 | 0.78 | 0.46 |
| Iron-etched SJK-5 4-8um | 52 | 5.7 | 1.55 | 276 | 0.68 | 0.34 |
| SJK-5 4-8um Baseline | - | 5.7 | 0.88 | 126 | 0.89 | 0.64 |
| 4-8um Polycrystalline | - | 4.7 | 2.9 | 168 | 0.84 | 0.60 |

Comparison of Material Removal and Wafer Surface Roughness Using 4-8um Diamond Powders in Slurry for Lapping Sapphire Wafers

Table 2

| DOE Run# | Start Size (um) | Final Size (um) | Diamond Wt % loss | Surface Area (m^2/g) | Material Removal (mg) | Roughness | Sphericity |
|---|---|---|---|---|---|---|---|
| 8 | 9 | 8.6 | 15 | 0.45 | 148 | 0.89 | 0.64 |
| 7 | 9 | 8.47 | 23 | 0.5 | 132 | 0.82 | 0.54 |
| 6 | 9 | 8.56 | 25 | 0.53 | 146 | 0.79 | 0.5 |
| 3 | 9 | 8.74 | 30 | 0.62 | 150 | 0.79 | 0.48 |
| 11 | 9 | 8.57 | 36 | 0.48 | 160 | 0.84 | 0.56 |
| 5 | 9 | 7.72 | 45 | 0.76 | 191 | 0.67 | 0.34 |
| 9 | 9 | 7.87 | 53 | 0.78 | 179 | 0.62 | 0.26 |
| 4 | 9 | 7.83 | 61 | 0.88 | 207 | 0.69 | 0.34 |
| Reference | Mono | 8.69 | --- | 0.55 | 115 | 0.92 | 0.69 |
| Reference | POLY | 8.07 | --- | 1.7 | 250 | 0.83 | 0.6 |

FIG. 13

Table 3

| Run # | Temperature (°C) | Time (hr) | Iron % (by wt) | Diamond % (by wt) | Diamond wt% loss |
|---|---|---|---|---|---|
| 8 | 750 | 1 | 60 | 40 | 15 |
| 7 | 750 | 2 | 60 | 40 | 23 |
| 6 | 750 | 1 | 80 | 20 | 25 |
| 3 | 850 | 1 | 60 | 40 | 30 |
| 11 | 750 | 2 | 80 | 20 | 36 |
| 5 | 850 | 1 | 80 | 20 | 45 |
| 9 | 850 | 2 | 60 | 40 | 53 |

Fig. 23

Feret diameter is defined as the distance between two parallel lines touching the boundary of a 2-dimensional image or particle profile.

The convex perimeter is formed from the intersection of many feret tangent lines.

Convex perimeter = $\sum \text{Ferets} \, (2\tan) \times \left( \dfrac{\pi}{2(\text{number of ferets})} \right)$

ABRASIVE PARTICLES HAVING A UNIQUE MORPHOLOGY

CROSS-REFERENCE TO RELATED APPLICATIONS

The instant application is related to and claims the benefit of U.S. Provisional Patent Application Ser. No. 61/097,422 filed Sep. 16, 2008, and U.S. Provisional Patent Application Ser. No. 61/187,789 filed Jun. 17, 2009.

TECHNICAL FIELD AND INDUSTRIAL APPLICABILITY

The present invention relates to abrasive particles having a unique morphology. More particularly, the invention relates to roughening the surface of diamond particles to enhance their performance in industrial applications.

BRIEF DESCRIPTION OF THE DRAWINGS

FIG. 2 is a Table 1 showing the physical characteristics and performance of 4-8 μm diamond particles, e.g. powders, before and after modification.

FIG. 13 shows Table 1 describing characteristics and performance of the diamond particles of an embodiment.

FIG. 23 shows Table 2 containing experimental conditions.

DETAILED DESCRIPTION

Figure 1A:
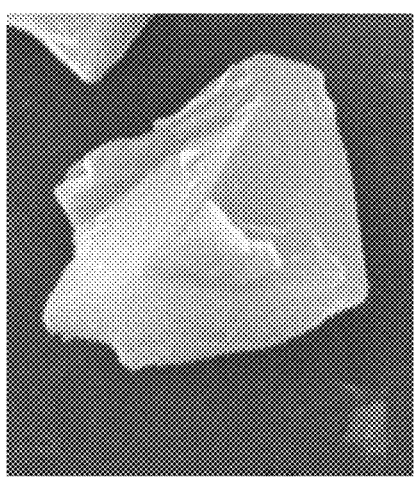
FIGS. 1A-1F are scanning electron microscope (SEM) images of conventional monocrystalline diamond, modified diamond using a nickel coating process and diamond modified using an iron powder process.

Before the present methods, systems and materials are described, it is to be understood that this disclosure is not limited to the particular methodologies, systems and materials described, as these may vary. It is also to be understood that the terminology used in the description is for the purpose of describing the particular versions or embodiments only, and is not intended to limit the scope. For example, as used herein and in the appended claims, the singular forms "a," "an," and "the" include plural references unless the context clearly dictates otherwise. In addition, the word "comprising" as used herein is intended to mean "including but not limited to." Unless defined otherwise, all technical and scientific terms used herein have the same meanings as commonly understood by one of ordinary skill in the art.

Unless otherwise indicated, all numbers expressing quantities of ingredients, properties such as size, weight, reaction conditions and so forth used in the specification and claims are to the understood as being modified in all instances by the term "about". Accordingly, unless indicated to the contrary, the numerical parameters set forth in the following specification and attached claims are approximations that may vary depending upon the desired properties sought to be obtained by the invention. At the very least, and not as an attempt to limit the application of the doctrine of equivalents to the scope of the claims, each numerical parameter should at least be construed in light of the number of reported significant digits and by applying ordinary rounding techniques.

As used herein, the term "about" means plus or minus 10% of the numerical value of the number with which it is being used. Therefore, about 50% means in the range of 45%-55%.

DEFINITIONS

In describing and claiming the invention, the following terminology will be used in accordance with the definitions set forth below.

The term "abrasive", as used herein, refers to any material used to wear away softer material.

The term "material removal", as used herein, refers to the weight of a workpiece removed in a given period of time reported in milligrams, grams, etc.

The term, "material removal rate", as used herein, refers to material removed divided by the time interval reported as milligrams per minute, grams per hour, etc.

The term "monocrystalline diamond", as used herein, refers to diamond that is formed either by high-pressure/high-temperature synthesis or a diamond that is naturally formed. Fracture of monocrystalline diamond proceeds along atomic cleavage planes. A monocrystalline diamond particle breaks relatively easily at the cleavage planes.

The term "particle" or "particles", as used herein, refers to a discrete body or bodies. A particle is also considered a crystal or a grain.

The term "pit", as used herein, refers to an indentation or crevice in the particle, either an indentation or crevice in the two-dimensional image or an indentation or crevice in an object.

The term "polycrystalline diamond", as used herein, refers to diamond formed by explosion synthesis resulting in a polycrystalline particle structure. Each polycrystalline diamond particle consists of large numbers of microcrystallites less than about 100 angstroms in size. Polycrystalline diamond particles do not have cleavage planes.

The term "spike", as used herein, refers to a sharp projection pointing outward from the centroid of a particle, a sharp projection pointing outward from the centroid of a two-dimensional image or a sharp projection pointing outward from an object.

The term "superabrasive", as used herein, refers to an abrasive possessing superior hardness and abrasion resistance. Diamond and cubic boron nitride are examples of superabrasives and have Knoop indentation hardness values of over 3500.

The term "weight loss", as used herein, refers to the difference in weight of a group of particles before being subject to the modification treatment and the weight of the same mass of diamond particles or abrasive particles after being subjected to the modification treatment.

The term "workpiece", as used herein, refers to parts or objects from which material is removed by grinding, polishing, lapping or other material removal methods.

The term "perimeter", as used herein, refers to the boundary of a closed plane figure or the sum of all borders of a two-dimensional image.

Figure 24:
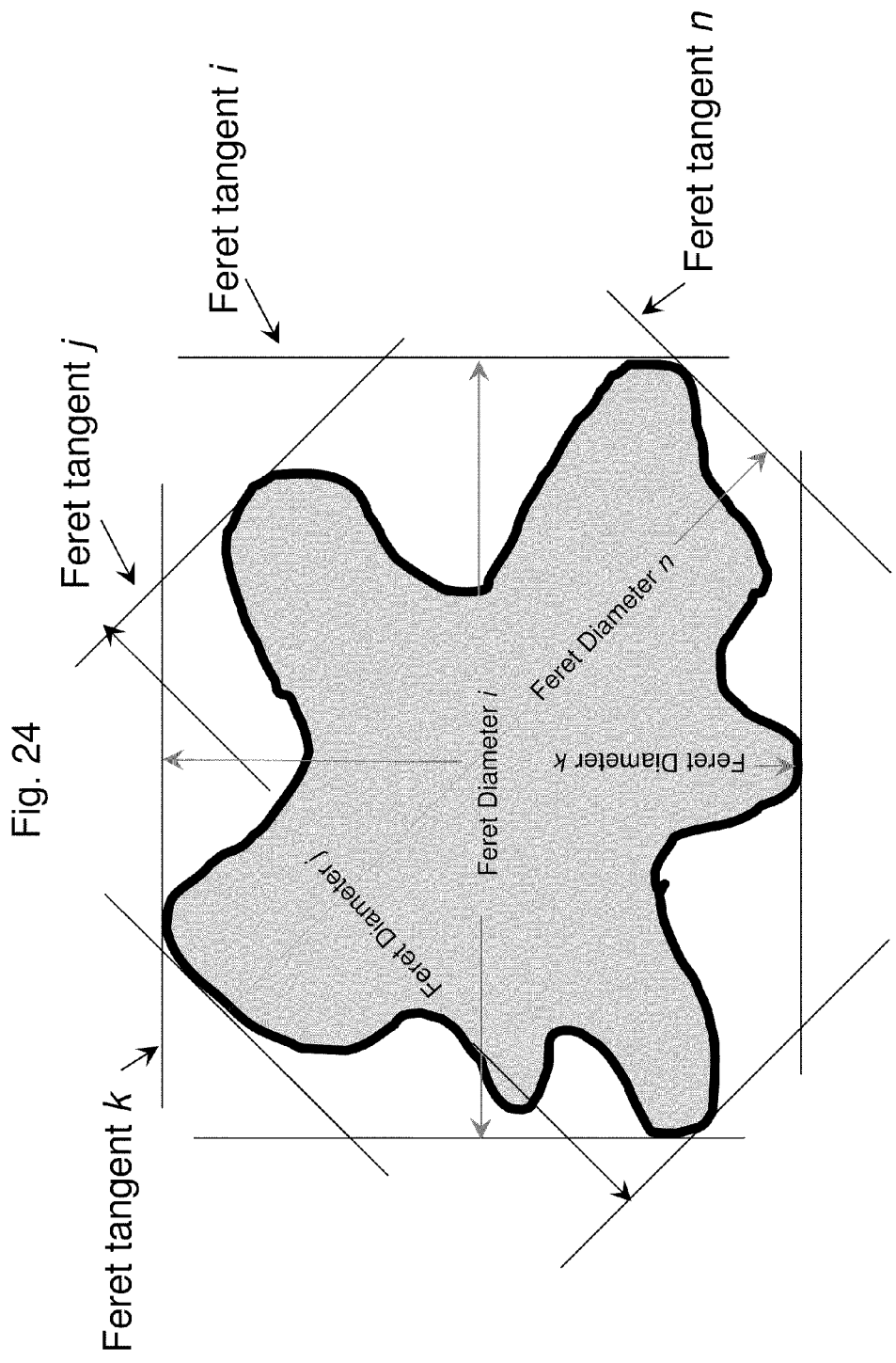
FIG. 24 is an illustration supplementing the "Definitions" section.
Figure 25:
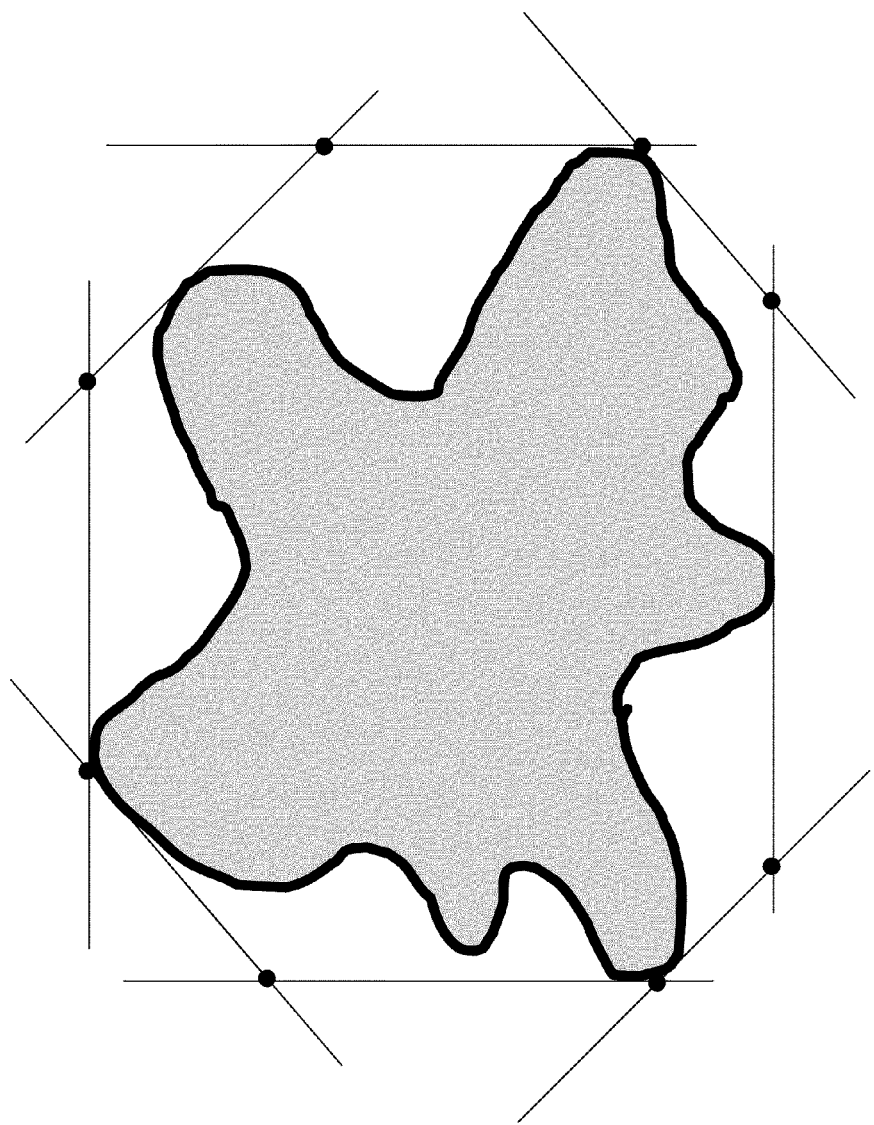
FIG. 25 is an illustration supplementing the "Definitions" section.
Figure 26:
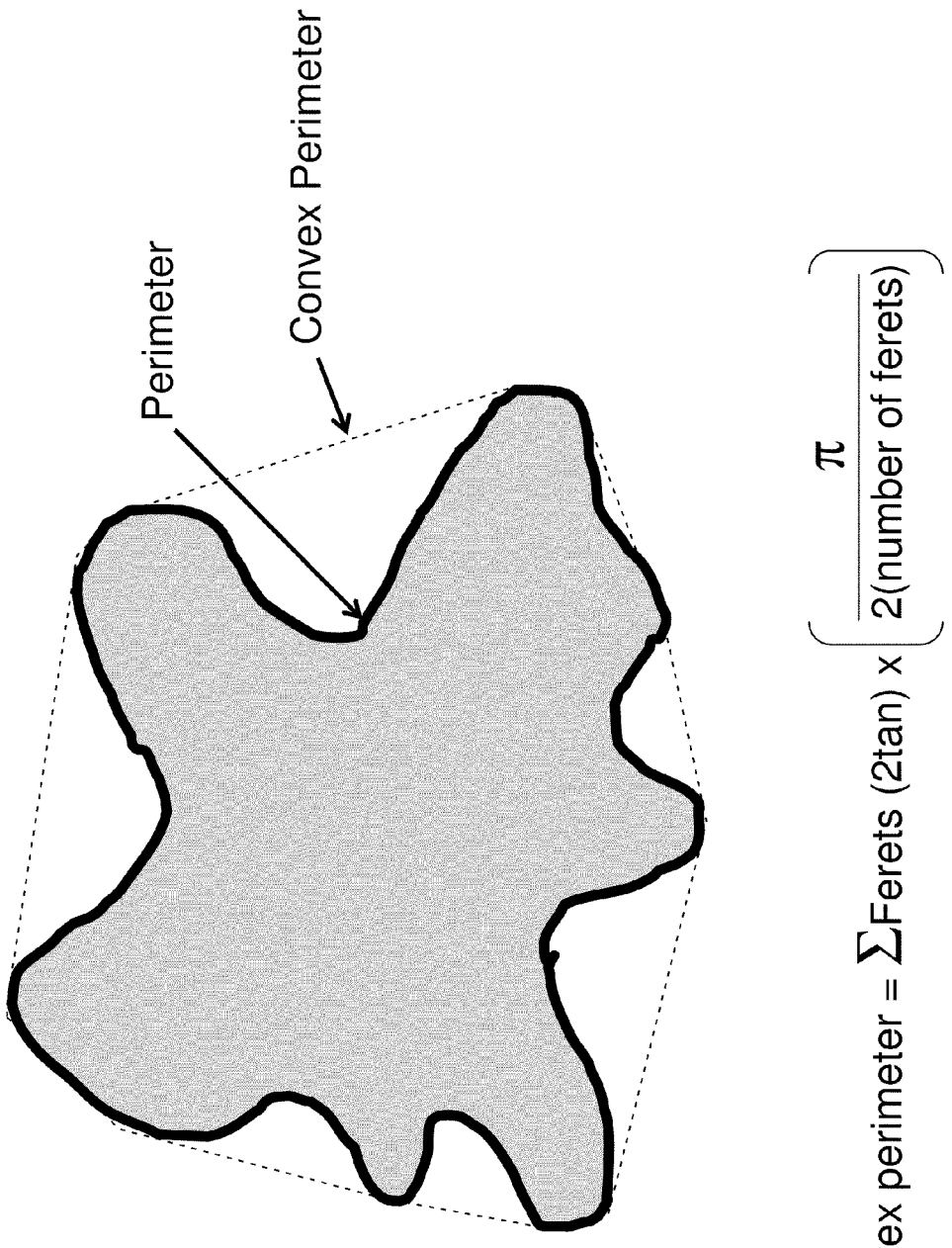
FIG. 26 is an illustration supplementing the "Definitions" section.

The term "convex perimeter", as used herein, refers to a line joining Feret tangent points, where Feret is the distance between two parallel tangents touching the boundary on each side of a two dimensional image or object. FIGS. 24-26 provide illustrations of these concepts.

The term "surface roughness", as used herein, refers to the measurement of a two-dimensional image that quantifies the extent or degree of pits and spikes of an object's edges or boundaries as stated in the CLEMEX image analyzer, Clemex Vision User's Guide PE 3.5 ©2001. Surface roughness is determined by the ratio of the convex perimeter divided by the perimeter.

i. $\text{Surface Roughness} = \frac{ConvexPerimeter}{Perimeter}$

Note that as the degree of pits and spikes increases, the surface roughness factor decreases.

The term "sphericity", as used herein, refers to the estimate of the enclosed area of a two dimensional image or object ($4\pi A$) divided by the square of perimeter ($p^2$).

i. $\text{Sphericity} = \frac{4\pi A}{p^2}$

The term "surface area" as used herein, refers to the external surface of a particle. When used with a plurality of particles, i.e., powder, the term specific surface area is used and is reported as surface area per gram of powder.

The term "wafer roughness" when referring to the surface of the sapphire are the features on the surface of the wafer. These features, which include the fine scratches or track marks from abrasive polishing, are measured using a contact or non-contact profilometer.

The terms diamond particle or particles and diamond powder or powders are used synonymously in the instant application and have the same meaning as "particle" defined above.

It is important to note that although the terms defined above refer to measuring two-dimensional particle profiles using microscopic measuring techniques, it is understood that the features extend to the three-dimensional form. Automated image analysis of particle size and shape is recognized by one skilled in the art as a reliable, reproducible method of measuring particle characteristics. Although the CLEMEX image analyzer was used, similar devices are available that will reproduce the data.

In one embodiment, monocrystalline diamond particles may be used. Monocrystalline diamond particles in sizes of less than about 100 microns are useful. However, diamond particles in sizes over about 100 microns may be used as well. The sizes of the diamond particles range from about 0.1 to about 1000 microns. One example of diamond particles that may be used is SJK-5 4-8 micron, synthetic industrial diamond particles manufactured by Diamond Innovations, Inc. (Worthington, Ohio, U.S.A).

In another embodiment, natural diamond particles, sintered polycrystalline diamond or shock synthesized polycrystalline diamond particles may be subjected to the modification treatment discussed below.

In an embodiment, other abrasives may be subjected to a modification treatment. Examples of abrasives include any material, such as minerals, that are used for shaping or finishing a workpiece. Superabrasive materials such as natural and synthetic diamond and boron, carbon and nitrogen compounds may be used. Suitable diamond materials may be crystalline or polycrystalline. Other examples of abrasive grains may include calcium carbonate, emery, novaculite, pumice dust, rouge, sand, ceramics, alumina, glass, silica, silicon carbide, and zirconia alumina.

In another embodiment, a reactive coating is used to modify the abrasive or superabrasive particles. Such reactive coatings include but are not limited to alkali metal hydroxides, such as lithium hydroxide, sodium hydroxide, potassium hydroxide, potassium carbonate, sodium peroxide, potassium dichromate and potassium nitrate, etc. The reactive coatings may also include a combination of alkali metal hydroxides.

Still other examples of metals that may be utilized as the reactive coating are those included in Group VIII of the Periodic table, their metal compounds and combinations thereof. Other examples of material that may be used as reactive coatings include the catalyst metals taught in U.S. Pat. No. 2,947,609 and the catalyst metals taught in U.S. Pat. No. 2,947,610.

In an embodiment, a metal coating is used as the reactive coating and the abrasive material is diamond. The weight ratio of diamond particles to the metal coating is about 10 wt % to about 90 wt % Ni or about 10 wt % to about 60 wt % Ni. However, it should be noted that these ratios are a matter of economic efficiency rather than technical effectiveness. In one embodiment, the metal coating at least partially covers the diamond particles. Alternatively, the metal coating may uniformly surround each diamond particle. It is not necessary that the metal be chemically bonded to the diamond. Nickel and/or nickel alloys may be used as a coating for the diamond. A method of application of the nickel to the diamond is with an electroless deposition process however methods such as electrolytic plating, physical vapor deposition or chemical vapor deposition may be used to coat the diamond particles with a layer of nickel.

In an embodiment, diamond particles are coated with from about 10 to about 60 weight percent nickel phosphorous coating. The coating process initially subjects the uncoated diamond particles to a solution of colloidal palladium. The fine palladium particles uniformly adsorb onto the surface of the diamond making the surface autocatalytic for electroless deposition of nickel. In the next stage of the process, the activated diamond is placed into nickel sulfamate solution containing about 10 grams per liter dissolved nickel. While the activated diamond and nickel suspension is mixing, sodium hypophosphate is added to the suspension and the temperature of the coating bath is maintained at about 80 degrees C. When the hypophosphate solution is added, all of the dissolved nickel in solution will autocatalytically deposit onto the activated diamond surfaces.

Depending on how much nickel deposits onto the diamond, more nickel may be added by replacing the spent nickel/hypophosphate solution with fresh solutions and repeating the process. If uniformly coating the particle, several cycles may be required to obtain a sufficiently uniform coverage of nickel over each of the diamond particles. By monitoring the number of cycles and controlling the coating bath parameters like temperature, pH and mixing energy, the nickel content on the diamond is very reproducible. It is not uncommon for the coated diamond to have some level of agglomerations as a consequence of the interactions of the diamond particles and nickel plating during the coating. So long as the individual particles that comprise the agglomerates contain some amount of nickel coating, the presence of agglomerates does not affect the quality of the process and no attempt at removing agglomerates is required.

After the diamond particles have been coated, the coated particles are placed into a furnace and, in a hydrogen atmosphere, vacuum atmosphere, or an inert gas atmosphere, heated from about 650° C. to about 1000° C. Temperatures of about 700° C. to about 950° C. or about 800° C. to about 900° C. may be used. The coated diamond may be heated for a period of time of from about five minutes up to about five hours. Time periods ranging from about thirty minutes up to about two hours or of about one to about two hours may be used.

After the heating cycle is complete and the particles are cooled, the modified diamond particles are recovered by dissolving the nickel coated diamond in common acids. Acids that may be used include hydrochloric acid, hydrofluoric acids, nitric acid and certain combinations thereof. Acids, or combinations thereof, are added in an acid-to-coated-diamond ratio of 100:1 up to 1000:1 (by volume). The mixture is then heated between about 100° C. to about 120° C. for a period of from about six to about eight hours. The solution is then cooled, the liberated diamond settles and the solution is decanted. The acid cleaning and heating steps are repeated until substantially all of the metal coating has been digested.

Subsequently, any converted graphite (carbon from diamond that has been converted to graphite during the reaction with nickel) is then removed from the diamond particles via any dissolution treatment method known in the art. An example of a common dissolution procedure includes the oxidation of graphitic carbons by gradual heating range between about 150° C. to about 180° C. in an acidic solution containing a mixture of $HNO_3$ and $H_2SO_4$.

Depending on the furnace conditions chosen, more or less reaction may occur between the metal and the diamond. The more the metal etches into the diamond, the more graphite is formed and, thus, more weight is lost by the diamond. To completely dissolve the graphite, higher quantities of acid may be used or additional dissolution treatments may be necessary. The diamond particles are then washed to remove acids and residue, such as in water. Subsequently, the diamond particles are dried in an oven, air dried, subjected to microwave drying or other drying methods known in the art.

Figure 1C:
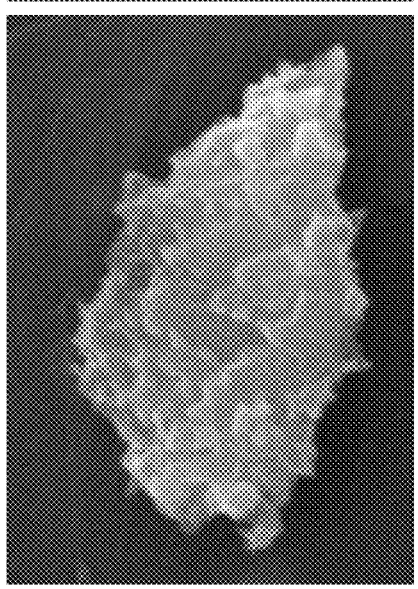
Figure 1E:
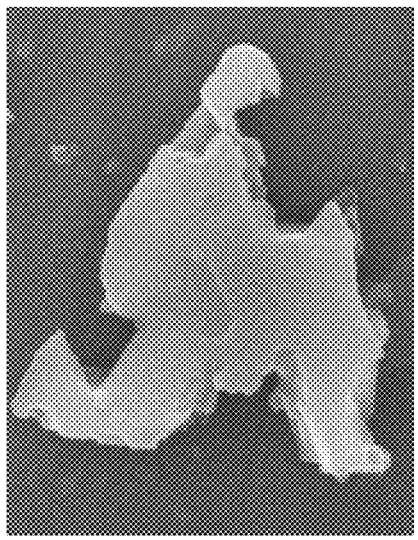
Figure 1B:
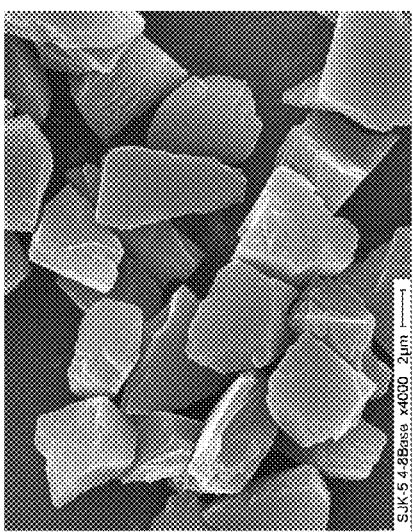
Figure 1D:
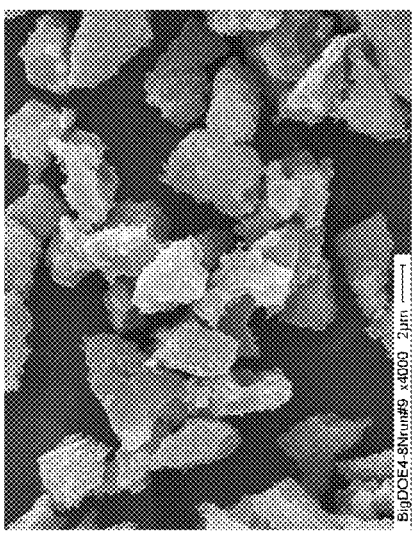
Figure 1F:
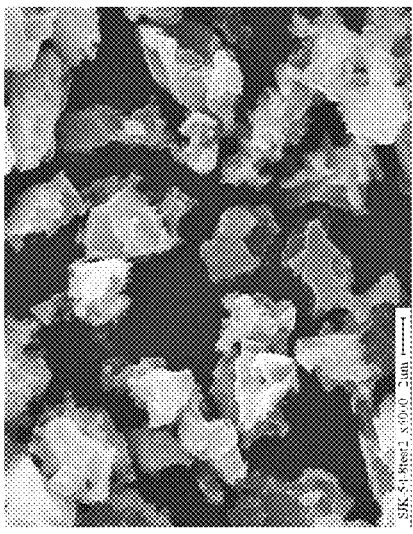

One embodiment pertains to monocrystalline diamond particles having very rough, irregular surfaces as shown in FIGS. 1C and 1D. FIG. 1D shows a population of diamond particles and FIG. 1C shows an enlargement of a particle from FIG. 1D. The particles have been modified using the method described above. In addition to the roughened appearance, the modified diamond particles have unique characteristics as compared to conventional monocrystalline diamond particles shown in FIGS. 1A and 1B. FIG. 1B shows a population of monocrystalline diamond particles and FIG. 1A shows an enlargement of a particle from FIG. 1B. The conventional monocrystalline diamond particles produced by milling were not subjected to the modification treatment.

As shown in FIG. 1D, the modified diamond particles include significantly more spikes and pits than conventional monocrystalline diamond shown in FIG. 1A. The spikes act as cutting edges when used in free-abrasive slurry applications. It has been discovered that the performance of the diamond particles of the instant application significantly improves when used in free abrasive lapping applications within a liquid slurry or suspension. When the modified diamond particles are used in a fixed bond system, the pits and the spikes help secure the particle within the bond system.

In an embodiment, metal particles are used to modify the diamond particles. The weight ratio of diamond particles to metal particles is 1:5 to 5:1. However, it should be noted that these ratios are a matter of economic efficiency rather than technical effectiveness. The size of the metal particles is in the range of about 0.05 microns to about 100 microns. The size of the metal particles is typically less than the size of the diamond particles. In an embodiment, iron particles may be used. Examples of iron particles that may be used in the process of an embodiment include grade HQ 1 μm carbonyl iron powder (BASF, Ludwigshafen, Germany).

Although iron powder has been mentioned as a powder used in carrying out the process, other metals such as cobalt, nickel, manganese and chrome and their metal compounds and combinations thereof may be used.

In another embodiment of making modified diamond particles, from about 10 to about 80 weight percent diamond particles and from about 20 to about 90 percent iron particles are mixed using any appropriate mixing method that achieves a uniform mixture. In an embodiment, the weighed portions of the iron and diamond particles are put into a jar, sealed and inserted into a mixing device such as a Turbula® shaker-mixer (Glen Mills, Inc., Clifton, N.J., U.S.A) for at least about one hour or, alternatively, about 30 minutes to about one hour. A binder may optionally be added to the mixture prior to mixing. Binders provide lubricity to particle surfaces allowing a denser packing and more intimate contact between the metal powder and diamond. Binders also help in holding a pressed body together as a green-body.

The mixture is then compressed so as to create an intimate mixture of diamond particles and iron particles. Any method may be used to compress the diamond particles and iron particles so long that they form an intimate mixture and the particles are in very close contact with one another. One method used to compress the mixture is to place the mixture into a fixed die set on a press. An example of a suitable press is a Carver® pellet press manufactured by Carver, Inc. (Wabash, Ind.). In the die press, the mixture is subjected to pressure between about 5 and about 50,000 psi, between about 10,000 to about 40,000 psi or between about 15,000 to about 30,000 psi to form a pellet. Although pelletizing the mixture is taught, it is not necessary that the mixture of diamond and iron particles be formed into a pellet, only that the particles be compressed so as to form intimate contact with one another. Isostatic or monostatic pressing with deformable tooling may also be used to achieve the intimate contact.

Alternatively, the mixture may also be compressed by pressing it into a thin sheet that is several millimeters to several inches thick, i.e., by high pressure compaction rolls or briquetting rolls. The formed sheets may then be cut into smaller sections for further processing as discussed below. Another method of compressing the mixture of iron and diamond particles includes mixing and extruding the mixture under pressure. Pelletizing the mixture of diamond and iron particles via a pelletizer or tumbling the mixture in a tumbling apparatus are also alternative methods that may be used to compress the mixture. The pellets, bricks, briquettes or cakes be formed by these methods may then be further processed as discussed below Additional methods of compressing the mixture of iron and diamond particles include injection molding, extrusion, pressing the mixture into a container or tape casting. Alternatively, individual diamond particles may be coated with metal particles by ion implantation, sputtering, spray drying, electrolytic coating, electroless coating or any other applicable method so long as, the iron and diamond particles are in intimate contact with each other.

After compressing the mixture of diamond and iron particles, the compressed mixture, which may be in a pellet, an aggregate or other condensed form, is placed into a furnace and, in a hydrogen atmosphere, vacuum atmosphere, or an inert gas atmosphere, heated from about 650° C. to about 1000° C. Temperatures of about 700° C. to about 900° C. or about 750° C. to about 850° C. may be used. The compressed mixture may be heated for a period of time of from about five minutes up to about five hours. Time periods ranging from about thirty minutes up to about two hours or of about one to about two hours may be used.

After the heating cycle is complete and the compressed mixture is cooled, the modified diamond particles are recovered by dissolving the iron particles in common acids. Acids that may be used include hydrochloric acid, hydrofluoric acids, nitric acid and combinations thereof. Acids, or combinations thereof, are added in an acid:compressed mixture (i.e., a pellet) ratio of 100:1 up to 1000:1 (by volume). The mixture is then heated between about 100° C. to about 150° C. for a period of from about six to about eight hours. The solution is then cooled, the liberated diamond settles and the solution is decanted. The acid cleaning and heating steps are repeated until substantially all of the iron has been digested.

Subsequently, any converted graphite (carbon from diamond that has been converted to graphite during the reaction with iron) is then removed from the particles via any dissolution treatment method known in the art. Example of a common dissolution procedure includes the oxidation of graphitic carbons by gradual heating range between about 150° C. to about 180° C. in an acidic solution containing a mixture of $HNO_3$ and $H_2SO_4$.

Depending on the furnace conditions chosen, more or less reaction may occur between the metal and the diamond. The more the metal powder etches into the diamond, the more graphite is formed and, thus, more weight is lost by the diamond. To completely dissolve the graphite, higher quantities of acid may be used or additional dissolution treatments may be necessary. The diamond particles are then washed to remove acids and residue, such as in water. Subsequently, the diamond particles are dried in a furnace, air dried, subjected to microwave drying or other drying methods known in the art.

An embodiment pertains to monocrystalline diamond particles having very rough, irregular surfaces as shown in FIGS. 9A-9D; FIGS. 10A-10D and FIGS. 11A-11D. In addition to the roughened appearance, the diamond particles have unique characteristics as compared to conventional monocrystalline diamond particles shown in FIG. 12. The conventional monocrystalline diamond particles produced by milling, shown in FIG. 12, were not subjected to the modification treatment.

Referring to FIG. 13, Table 2 contains data including sizes, weight loss, surface area, material removal, roughness and sphericity for a sample of monocrystalline diamond particles (9 µm). Additionally, comparative data for both a conventional monocrystalline diamond particle and a conventional polycrystalline diamond particle of similar particle sizes are shown. This data was used to create the graphs in FIGS. 14 and 15 as discussed below.

Figure 12:
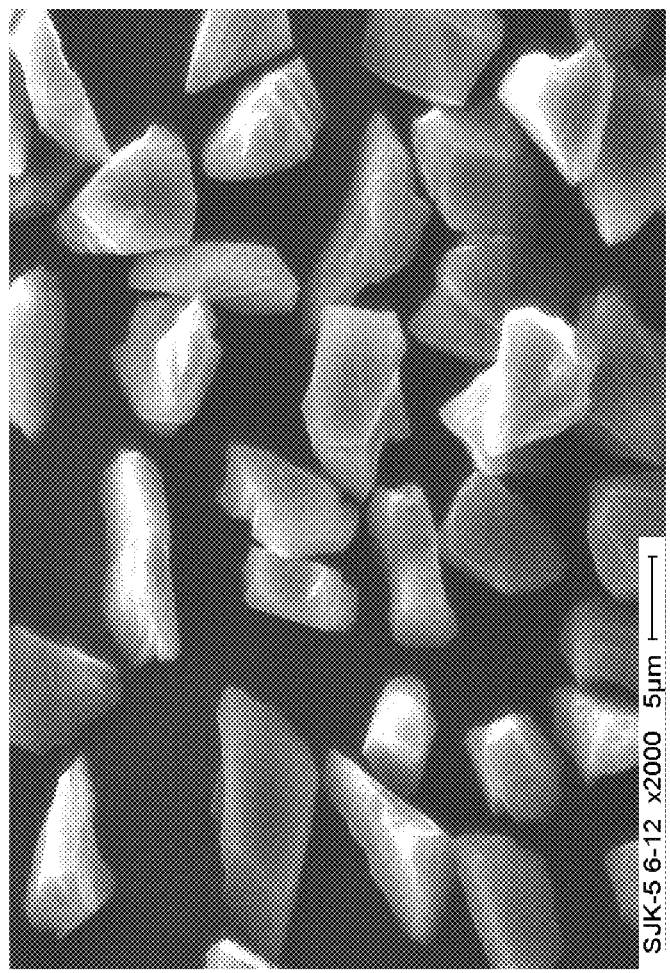
FIG. 12 is a scanning electron microscope (SEM) image of conventional monocrystalline diamond particles.

As shown in FIGS. 9A-9D; FIGS. 10A-10D and FIGS. 11A-11D, the diamond particles are very different in appearance compared to conventional monocrystalline diamond particles as shown in FIG. 12. FIGS. 9A-9D show SEM images of the diamond particles of Run #4; FIGS. 10A-10D shows SEM images of the diamond particles of Run#5 and FIGS. 11A-11D show SEM images of the diamond particles of Run #9. FIG. 13 (Table 2) lists the corresponding properties and characteristics of the diamond particles from additional samples.

As shown in FIGS. 9A-9D; FIGS. 10A-10D and FIGS. 11A-11D, the diamond particles include spikes and pits. The spikes act as cutting edges when used in free-abrasive slurry applications. It has been discovered that the performance of the modified diamond particles significantly improves when used in free abrasive lapping applications within a liquid slurry or suspension. When the modified diamond particles are used in a fixed bond system, the pits and/or the spikes help secure the particle within the bond system.

Figure 14:
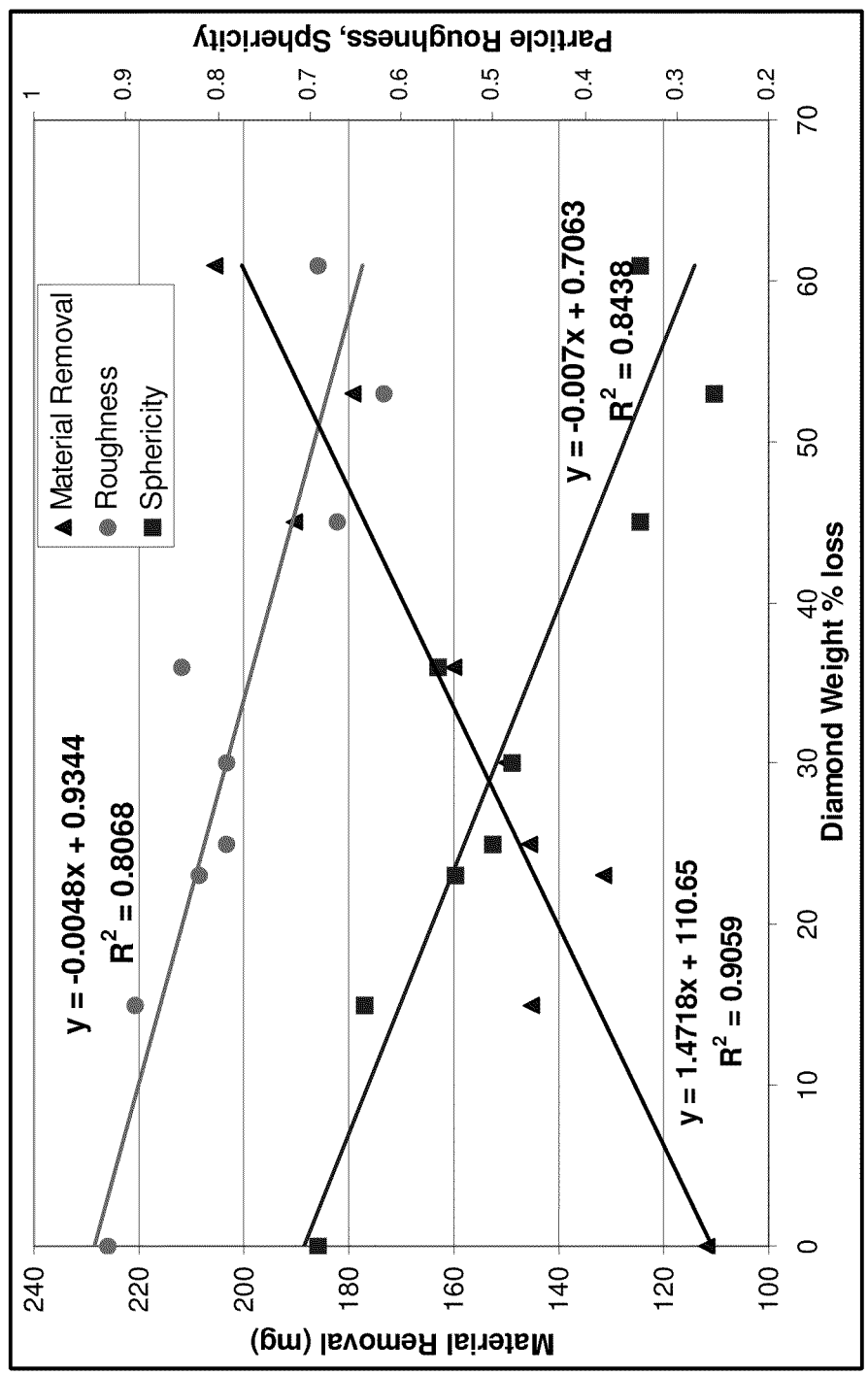
FIG. 14 is a graph depicting characteristics and performance of the diamond particles of an embodiment.

The modified diamond particles exhibit unique characteristics in surface roughness, sphericity and material removal. FIG. 14 shows these characteristics as compared to weight loss of the modified diamond particles. Details has to how the measurements were obtained are discussed in Example IV. As shown in FIG. 14, the weight loss of the diamond particles is between greater than 0% to about 70%.

As shown in FIG. 14, diamond particles exhibit a surface roughness of less than about 0.95. Surface roughness of between about 0.50 and about 0.80 and between about 0.50 and about 0.70 is also observed. Surface roughness of the diamond particle is a function of the size of the metal particle (s), amount of metal particle(s) in contact with the diamond, reaction time and temperature used. As can be seen in FIG. 14, as the surface roughness factor decreases (roughness increases) the ability of the diamond to perform material removal in a lapping process (described in EXAMPLE IV) increases from about 125 mg for a surface roughness factor of about 0.92 to about 200 mg for a surface roughness factor of about 0.62; an increase of about 60 percent. This may be attributed to the increased number of cutting points that the surface modification provides.

FIG. 14 also shows that the diamond particles also exhibit sphericity readings of less than about 0.70. Sphericity readings of about 0.2 to about 0.5 and about 0.25 to 0.4 are also observed. Although sphericity is an independent feature from surface roughness, it can be observed that there is a strong correlation between sphericity and the lapping performance of the diamond as shown in FIG. 14. In FIG. 14, it can be shown that the material removal increases from about 125 mg for a sphericity of about 0.70 to about 200 mg for a sphericity of about 0.25. Also, as can be seen in FIG. 14, there is a strong correlation between the weight loss of the diamond powder and the lapping performance as indicated by the increase in material (sapphire) removal. As the weight loss of diamond increases, the diamond becomes more aggressive in its ability to remove material.

Figure 15:
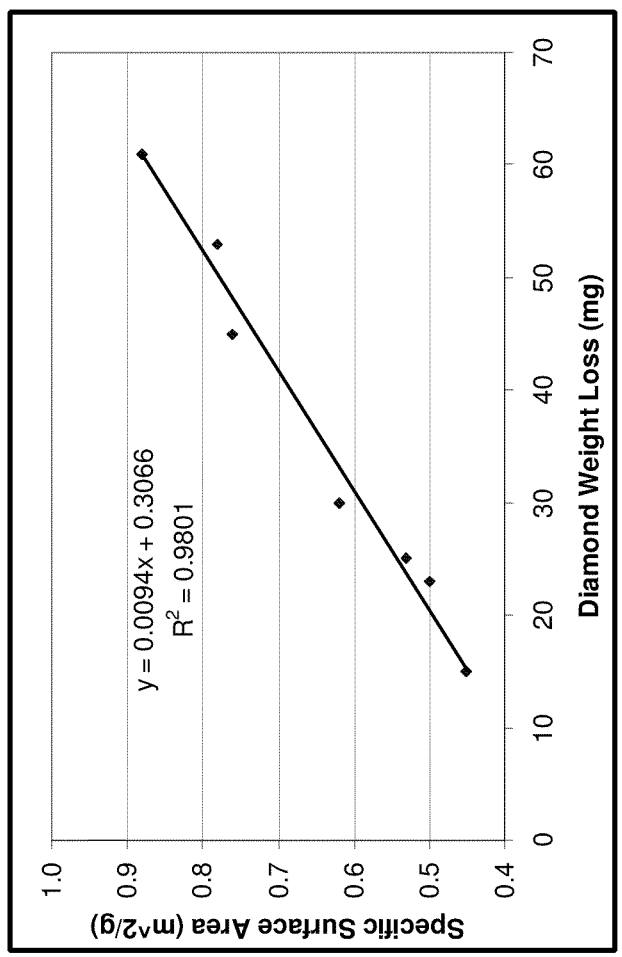
FIG. 15 is a graph showing the characteristics of the diamond particles of an embodiment.

FIG. 15, is a graph showing diamond weight loss (%) vs. surface area. The readings were taken from a population of 9 μm diamond particles. The specific surface area of the modified diamond particles having weight loss greater than 35% is about 20% higher compared to conventional diamond particles having the same particle size distribution. It can be observed that the specific surface area of the particles is directly proportional to the extent of the reaction of the diamond particles and iron particles during the modification treatment process. For example, specific surface area readings of the diamond particles range from about 0.45 to about 0.90 m$^2$/g.

Figure 19:
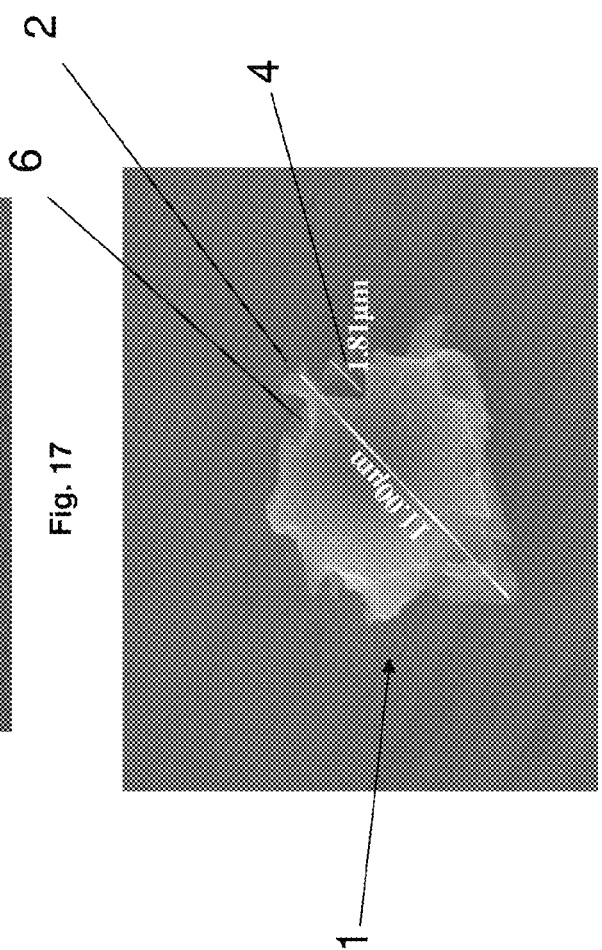
FIG. 19 is a scanning electron microscope (SEM) image of a diamond particle of an embodiment.
Figure 17:
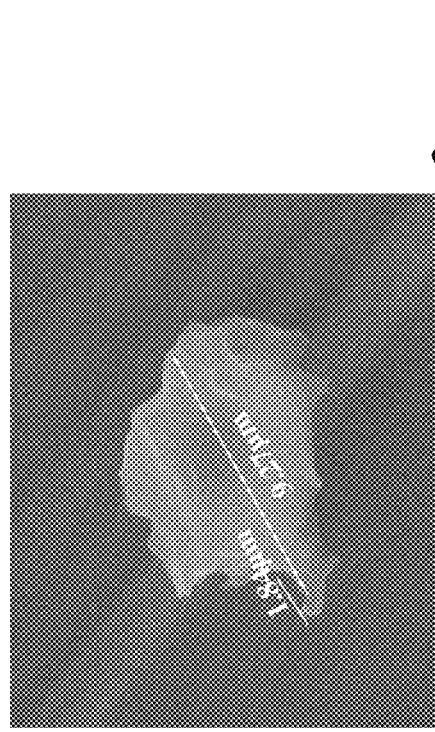
FIG. 17 is a scanning electron microscope (SEM) image of a diamond particle of an embodiment.
Figure 16:
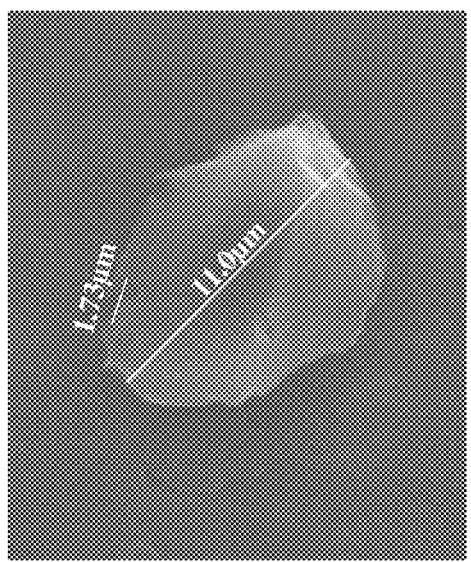
FIG. 16 is a scanning electron microscope (SEM) image of a diamond particle of an embodiment.
Figure 18:
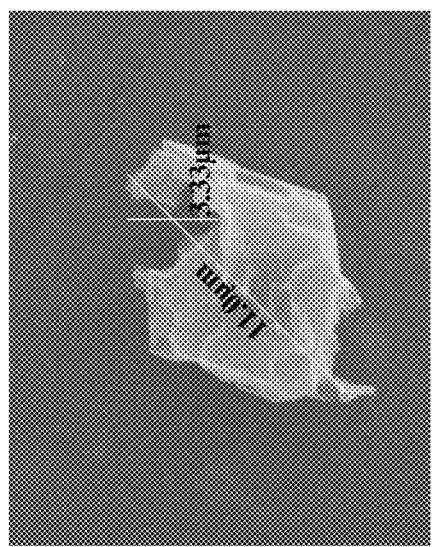
FIG. 18 is a scanning electron microscope (SEM) image of a diamond particle of an embodiment.
Figure 21:
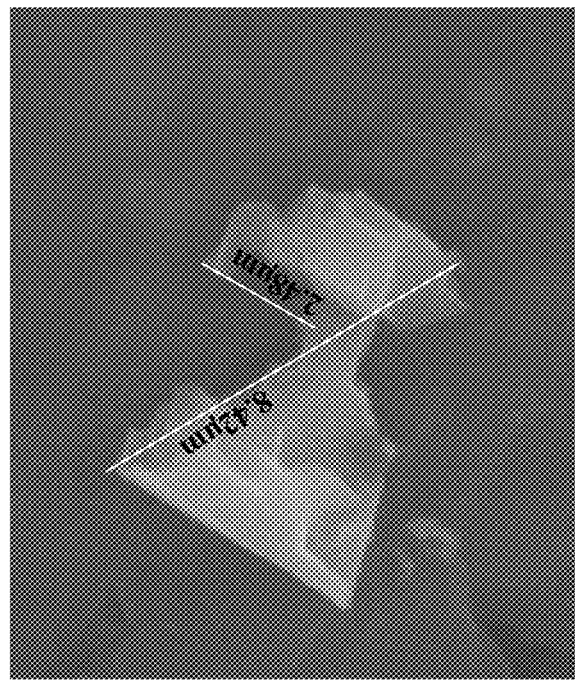
FIG. 21 is a scanning electron microscope (SEM) image of a diamond particle of an embodiment.
Figure 20:
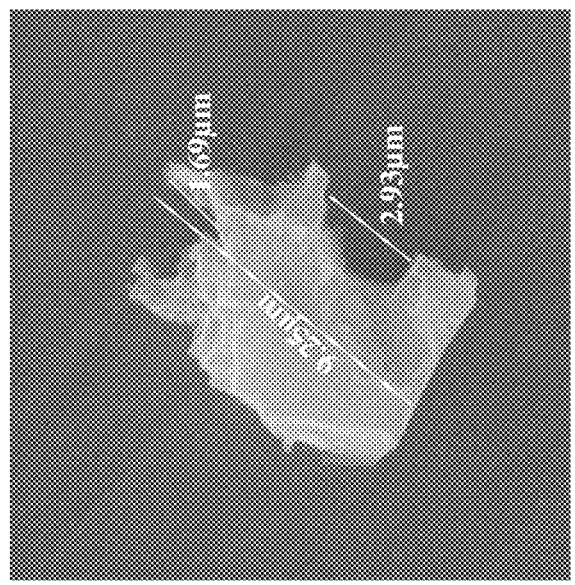
FIG. 20 is a scanning electron microscope (SEM) image of a diamond particle of an embodiment.

FIGS. 16-19 show examples of various diamond particles that have been subjected to varying degrees of treatment with iron. FIG. 16 shows a diamond particle that was heated at a temperature of 750° C. for 1 hour in 60% by weight iron resulting in a 15% weight loss of the diamond particle. FIG. 17 shows a diamond particle that was heated at a temperature of 750° C. for 1 hour in 80% by weight iron resulting in a 25% weight loss of the diamond particle. FIG. 18 shows a diamond particle that was heated at a temperature of 850° C. for 1 hour in 60% by weight iron resulting in a 30% weight loss of the diamond particle. FIG. 19 shows a diamond particle that was heated at a temperature of 850° C. for 1 hour in 80% by weight iron resulting in a 45% weight loss of the diamond particle. FIG. 20 shows a diamond particle that was heated at a temperature of 850° C. for 2 hours in 60% by weight iron resulting in a 53% weight loss of the diamond particle. FIG. 21 shows a diamond particle that was heated at a temperature of 850° C. for 2 hours in 80% by weight iron resulting in a 61% weight loss of the diamond particle.

The modified diamond particles contain one or more pits and/or spikes. An example of a diamond particle exhibiting these features is shown in FIG. 19. Diamond particle 1, having a weight loss of about 45%, includes pits 4,6 that form spike 2. The lengths of the spikes and depths of the pits vary according to the modification treatment parameters. The average depth of the pits on a particle ranges in size from about 5% to about 70% of the longest length of the particle.

The modified abrasive particles, as described above, may be useful in many applications including free abrasive applications, fixed abrasive applications, lapping, grinding, cutting, polishing, drilling, dicing, sintered abrasives or abrasive compacts, and wire for wire saws. In general, one would expect that the roughened surface would aid in the retention of the diamond particle within the tool or resin bond system.

With regard to wire saw applications, the abrasive particle may be attached to a wire by electroplating, metal sintering or polymeric or resin bonds. Electroplated wire saws generally contain a single layer of abrasive particles co-deposited with a layer of nickel metal. Some wires also use a resin to attach the abrasives to the wire. The use of the modified diamond particles would aid in providing better retention of the abrasive particle in the metal or resin matrix, hence increasing the life of the wire saw. The modified abrasive particles may also provide higher material removal rate with better free-cutting ability.

Materials typically cut with wire saws include silicon, sapphire, SiC, metals, ceramics, carbon, quartz, stone, glass composites, and granite.

The abrasive particles are also useful in slurries and other carrier liquids. A typical slurry solution may include the modified diamond particles ranging in size of from about 0.1 to about 100 microns present in a concentration of about 0.2 to about 50 percent by weight, a major vehicle such as a water-based vehicle, glycol-based vehicle, oil-based vehicle or hydrocarbon-based vehicles and combinations thereof and optional additives including surfactants, pH and color adjusters, and viscosity modifying agents.

In another embodiments, the modified abrasive particles and superabrasives may be optionally coated with a coating, after modification, such as a material selected from Groups IVA, VA, VIA, IIIb and IVb of the periodic table and including alloys and combinations thereof. A non-metallic coating that may be used is silicon carbide.

EXAMPLE I

A 4-8 μm monocrystalline diamond particles, e.g., diamond powder, with a nominal mean size of 6 μm was coated with a nickel/phosphorous coating (90% Ni/10% P). The nickel coated diamond powder contained 30 weight percent NiP and 70 weight percent diamond. Each diamond particle was uniformly covered with the NiP coating. Two 25 gram samples of the Ni coated powder were heated in a furnace. One 25 gram sample was heated at 825° C. for 1 hour and the other at 900° C. in a hydrogen atmosphere for 2 hours. After the heating cycle was completed and the coated diamond powder was cooled to room temperature, the modified diamond particles were recovered by dissolving the nickel coated diamond in two liters of nitric acid. The mixture was then heated to 120° C. for a period of five hours. The solution was then cooled to room temperature, the liberated diamond settled and the solution was decanted. The acid cleaning and heating steps were repeated one additional time until substantially all of the nickel had been digested.

After the nickel was removed from the diamond, the converted graphite (carbon from diamond that has been converted to graphite during the reaction with nickel) was then removed from the particles using 2 liters of sulfuric acid heated to 150° C. for seven hours. The solution was then cooled to room temperature, the diamond allowed to settle and the solution was decanted. The sulfuric acid cleaning and heating steps were repeated one additional time until substantially all of the graphite had been digested.

Measurements of weight loss, surface roughness and sphericity were obtained from the material recovered from this experiment. Included in this analysis was the SJK-5 4-8 μm diamond that was modified using a fine iron powder process as described herein. Also included is data for a polycrystalline diamond powder of similar nominal size.

The surface roughness and sphericity were obtained from images of the base material and modified diamond particles taken with a Hitachi model S-2600N Scanning Electron Microscope (SEM) at a 2500× magnification. The SEM images were saved as TIFF image files which were then uploaded into a Clemex image analyzer Vision PE 3.5 that was calibrated to the same magnification (2500×). In this example and for this magnification, the calibration resulted in 0.0446 μm/pixel resolution. The image analysis system measured particle size and shape parameters on a particle by particle basis. Measurements for a population of at least 50 particles from each set of experiments were generated automatically by the Clemex image analyzer. Mathematical formulas used by the image analyzer device to derive the measurements are found in the "Definitions" section above and can also be found in the Clemex Vision User's Guide PE 3.5 ©2001. Surface characteristics of the diamond particles of the five powder samples are shown in FIG. 2 (Table 1).

As can be seen from FIG. 1C, the surface texture of the modified diamond particles produced using the nickel coating method is significantly different than the surface texture of the starting material shown in FIG. 1A. It is apparent that, at temperatures above 800° C., the nickel reacts with the diamond and creates a unique texture that can be described by roughness and sphericity factors using the image analysis method. Based on the data obtained in this example, the roughness values changed from 0.89 to 0.77 for the 35 percent weight loss sample and from 0.89 to 0.78 for the 56 percent weight loss diamond. The sphericity values changed from 0.64 to 0.47 for the 35 percent weight loss sample and from 0.64 to 0.46 for the 56 percent weight loss diamond after the modification process.

Figure 6B:
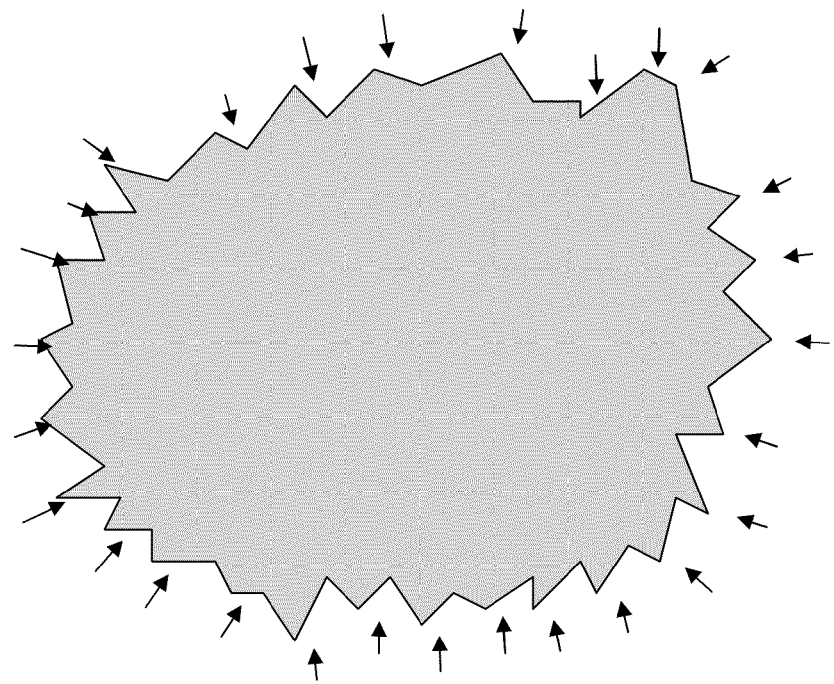
FIGS. 6A and 6B are comparative drawings of conventional diamond particle (6A) and a modified diamond particle (6B).
Figure 6A:
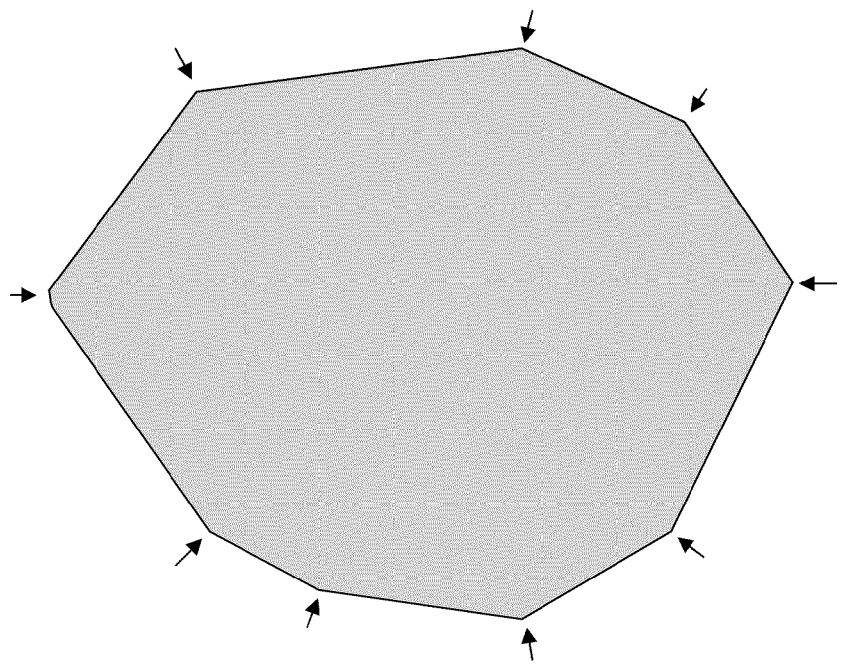
Figures 7, 8:
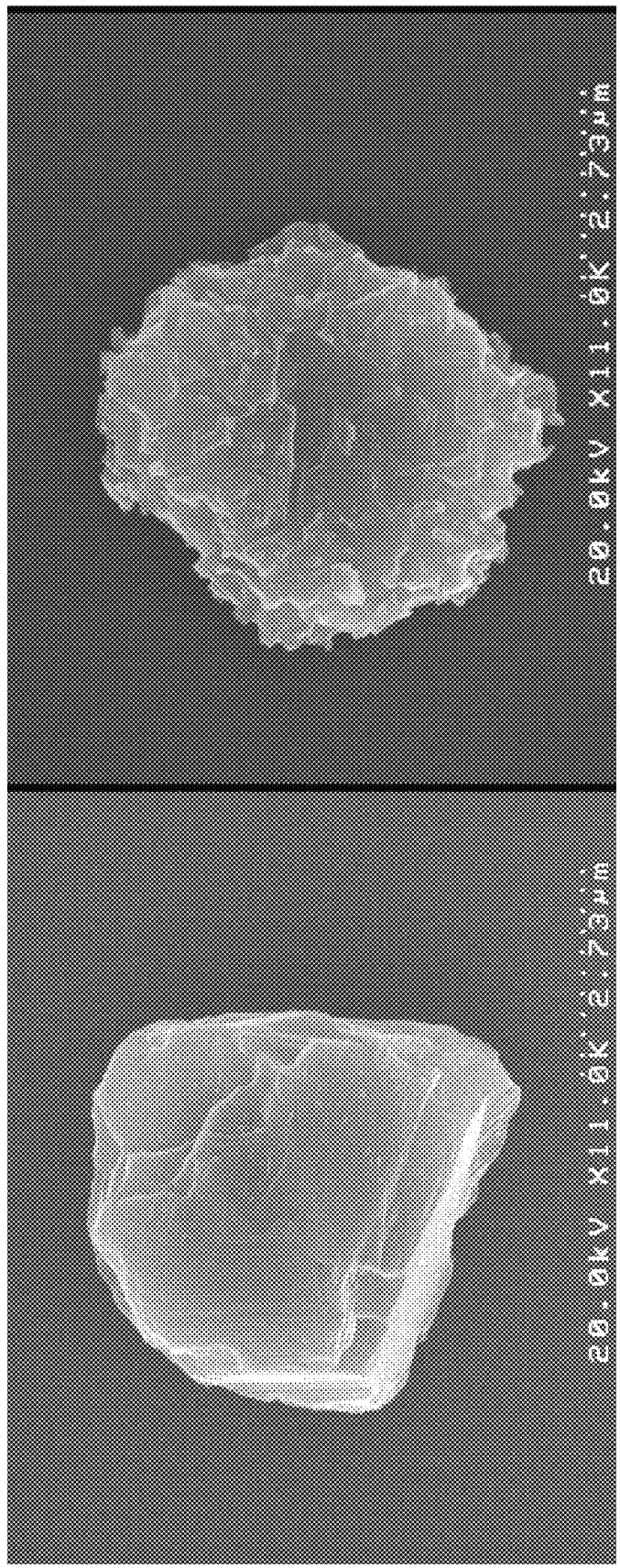
FIG. 7 is an SEM image of a conventional diamond particle.
FIG. 8 is an SEM image of a modified diamond particle using a nickel coating process.
Figure 9B:
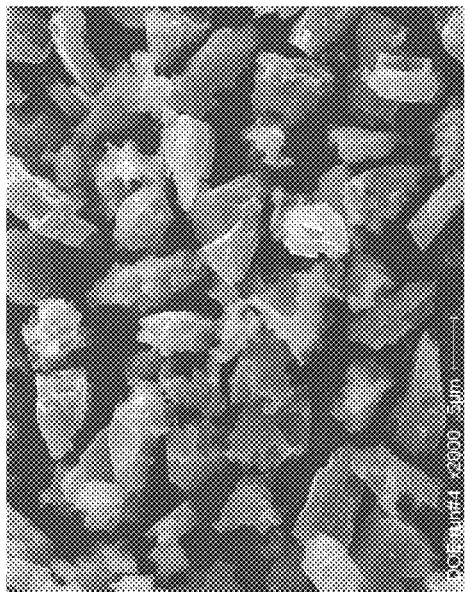
FIG. 9A-9D are scanning electron microscope (SEM) images of the diamond particles of an embodiment.
Figure 9D:
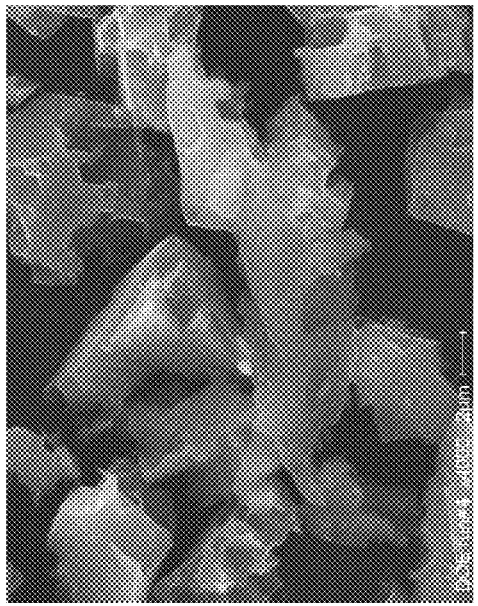
Figure 9A:
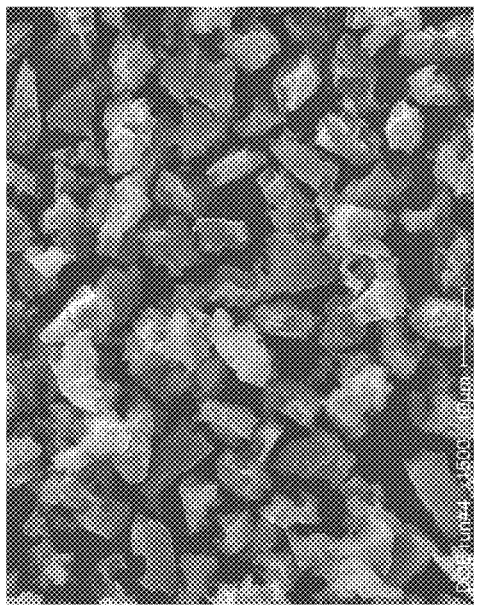
Figure 9C:
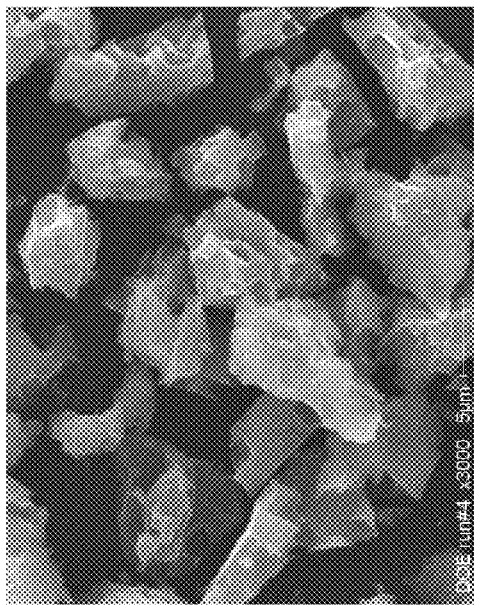
Figure 10A:
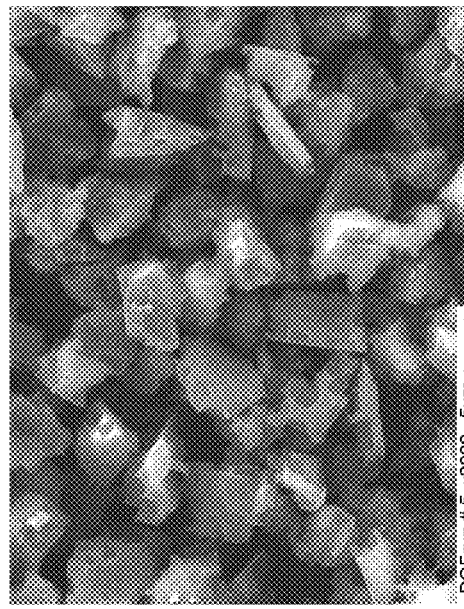
FIGS. 10A-10D are scanning electron microscope (SEM) images of the diamond particles of an embodiment.
Figure 10B:
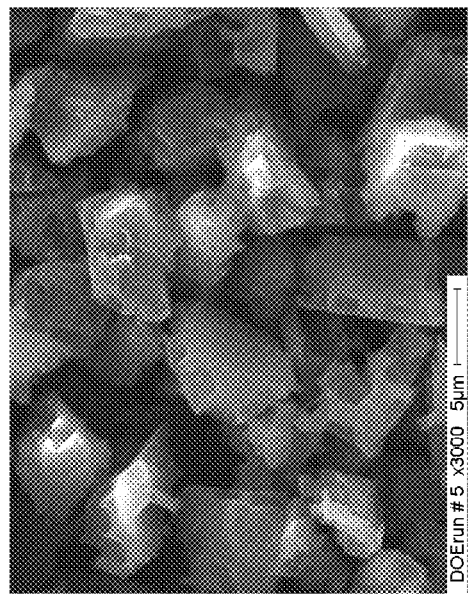
Figure 10C:
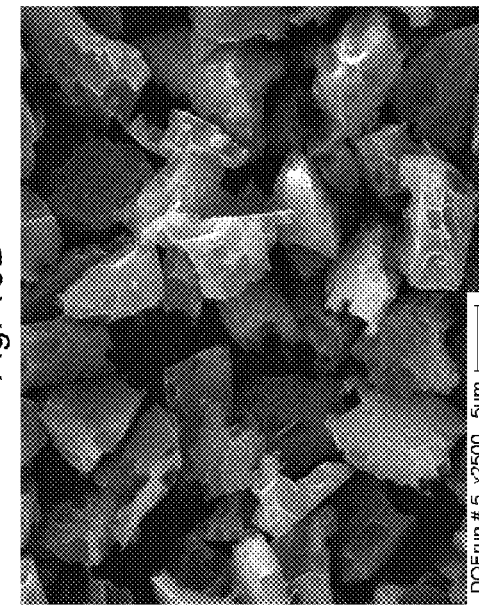
Figure 10D:
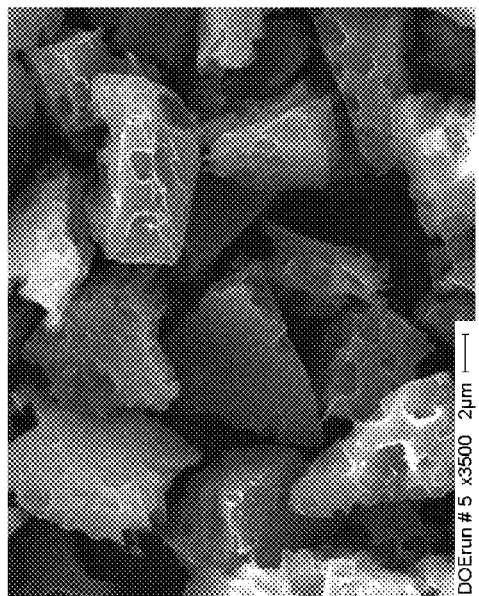
Figure 11A:
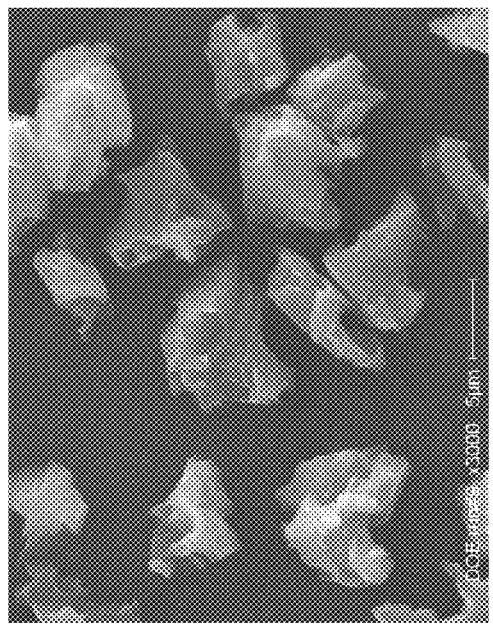
FIGS. 11A-11D are scanning electron microscope (SEM) images of the diamond particles of an embodiment.
Figure 11B:
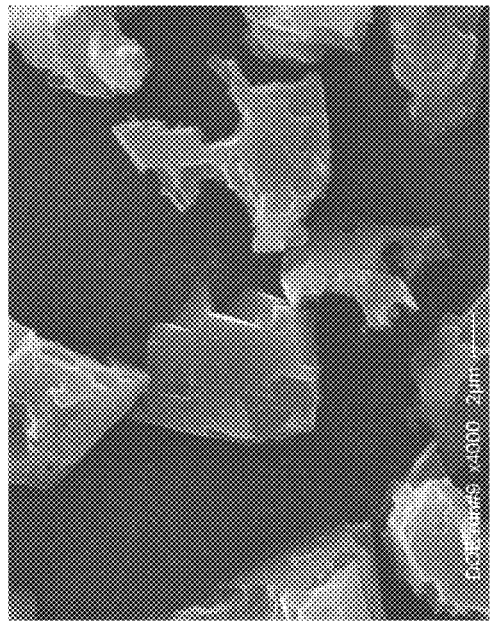
Figure 11C:
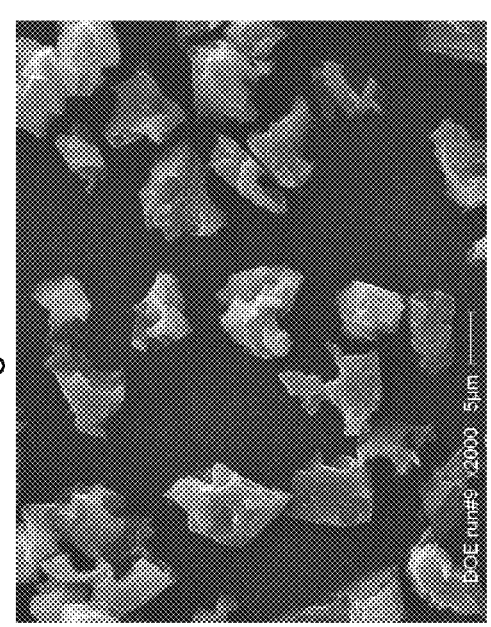
Figure 11D:
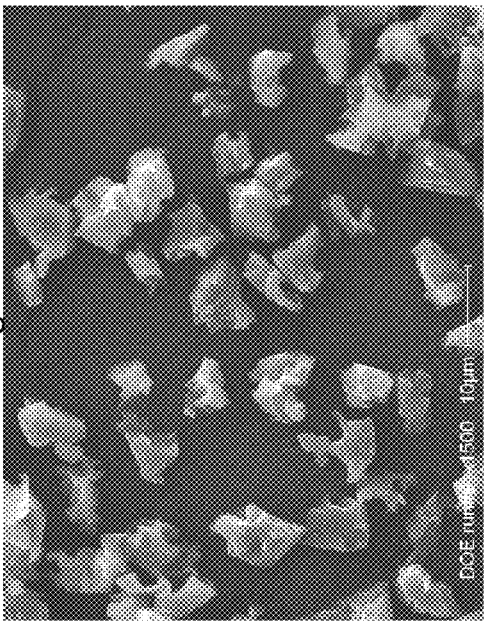

Note that, as can be seen in FIG. 2 (Table 1), although the modification process at 900° C. results in a higher weight loss of diamond, and a slightly finer size and slightly higher specific surface area compared to the process performed at 825° C., there is essentially no difference in the roughness and sphericity of these two samples. The surface texture produced of the diamond particles can be qualitatively described as having many small "teeth" or cutting points. Although these features are most apparent when looking at the boundary of particle profiles, they also exist across the entire surface of each particle. It is thought that the increase in the number of cutting points, or teeth, is responsible for the improved performance of the modified diamond particles. FIG. 6B shows a two-dimensional illustration of the cutting points or teeth of a modified diamond particle. FIG. 6A shows a two-dimensional illustration of a conventional monocrystalline diamond particle that has not been modified with a metal coating. FIG. 7 is an SEM image of a conventional monocrystalline diamond particle that has not been modified with metal coating. FIG. 8 is an SEM image of showing the cutting points or teeth of a diamond particle modified with nickel coating.

Figure 3:
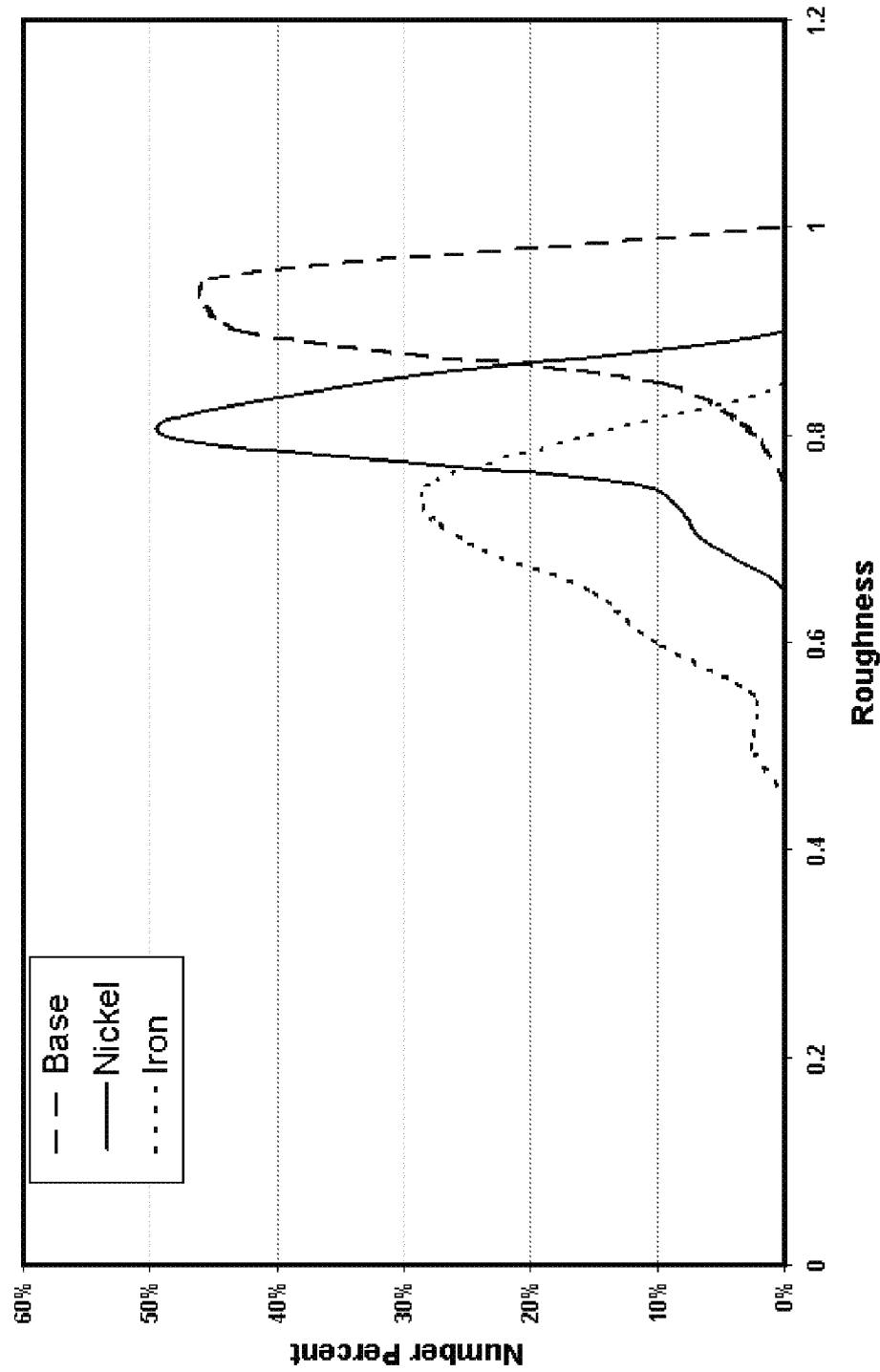
FIG. 3 is a graph that shows the surface roughness distribution of conventional diamond powder, modified diamond powder using a nickel coating process and a diamond powder modified using an iron powder process.
Figure 4:
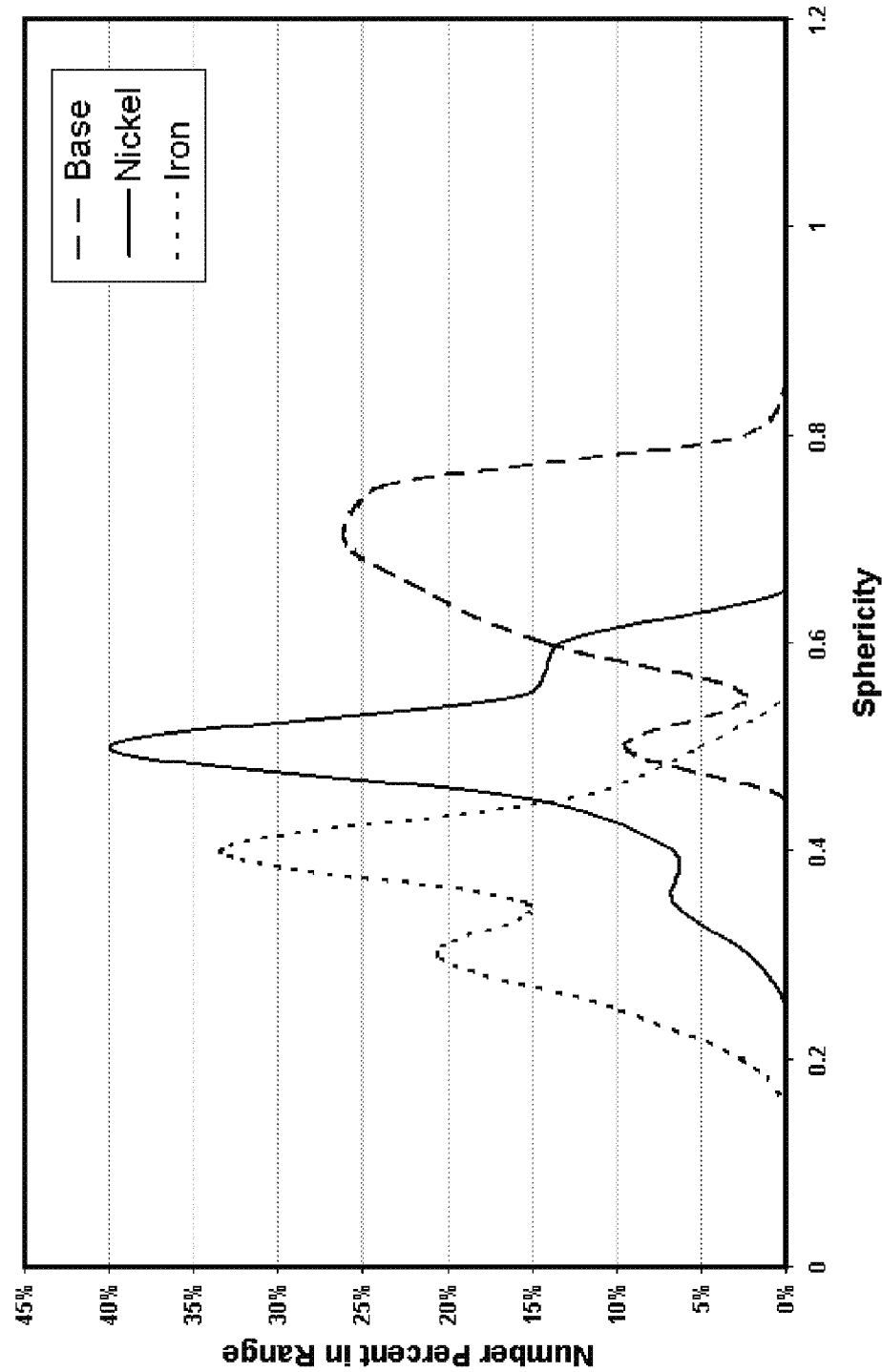
FIG. 4 is a graph that shows the sphericity distribution of conventional diamond powder, modified diamond powder using a nickel coating process and a diamond powder modified using an iron powder process.

For purposes of distinction, the surface texture of the modified particles is different from the texture that was produced using the iron powder modification process as taught above. As shown in FIG. 1E, the iron powder modified particles display deep pits and spikes. The average roughness of the iron powder modified diamond is 0.68 and the average sphericity is 0.34. As shown in FIGS. 3 and 4, these values are significantly different than the values measured for the nickel-coated modified diamond particles. It can also be seen that, although the particles modified by iron powder do not have as many cutting points per unit length of perimeter as the nickel coated modified diamond, the deeper pits and pockets could be useful in providing better retention within a bond system.

EXAMPLE II

A MBG-620 70/80 mesh monocrystalline diamond particles was coated with a nickel/phosphorous coating (90% Ni/10% P). The nickel coated diamond powder contained 56 weight percent NiP and 44 weight percent diamond. Each diamond particle was uniformly covered with the NiP coating. 5 grams sample of the Ni coated powder were heated in a furnace at 1000° C. for 1 and half hour under hydrogen environment. After the heating cycle was completed and the coated diamond powder was cooled to room temperature, the modified diamond particles were recovered by dissolving the nickel coated diamond in 500 ml of nitric acid. The mixture was then heated to 120° C. for a period of five hours. The solution was then cooled to room temperature, the liberated diamond settled and the solution was decanted. The acid cleaning and heating steps were repeated one additional time until substantially all of the nickel had been digested.

After the nickel was removed from the diamond, the converted graphite was then removed from the particles using 500 ml of sulfuric acid and 100 ml nitric acid and heated to 150° C. for seven hours. The solution was then cooled to room temperature, the diamond allowed to settle and the solution was decanted. The sulfuric acid cleaning and heating steps were repeated one additional time until substantially all of the graphite had been digested.

Figure 27A:
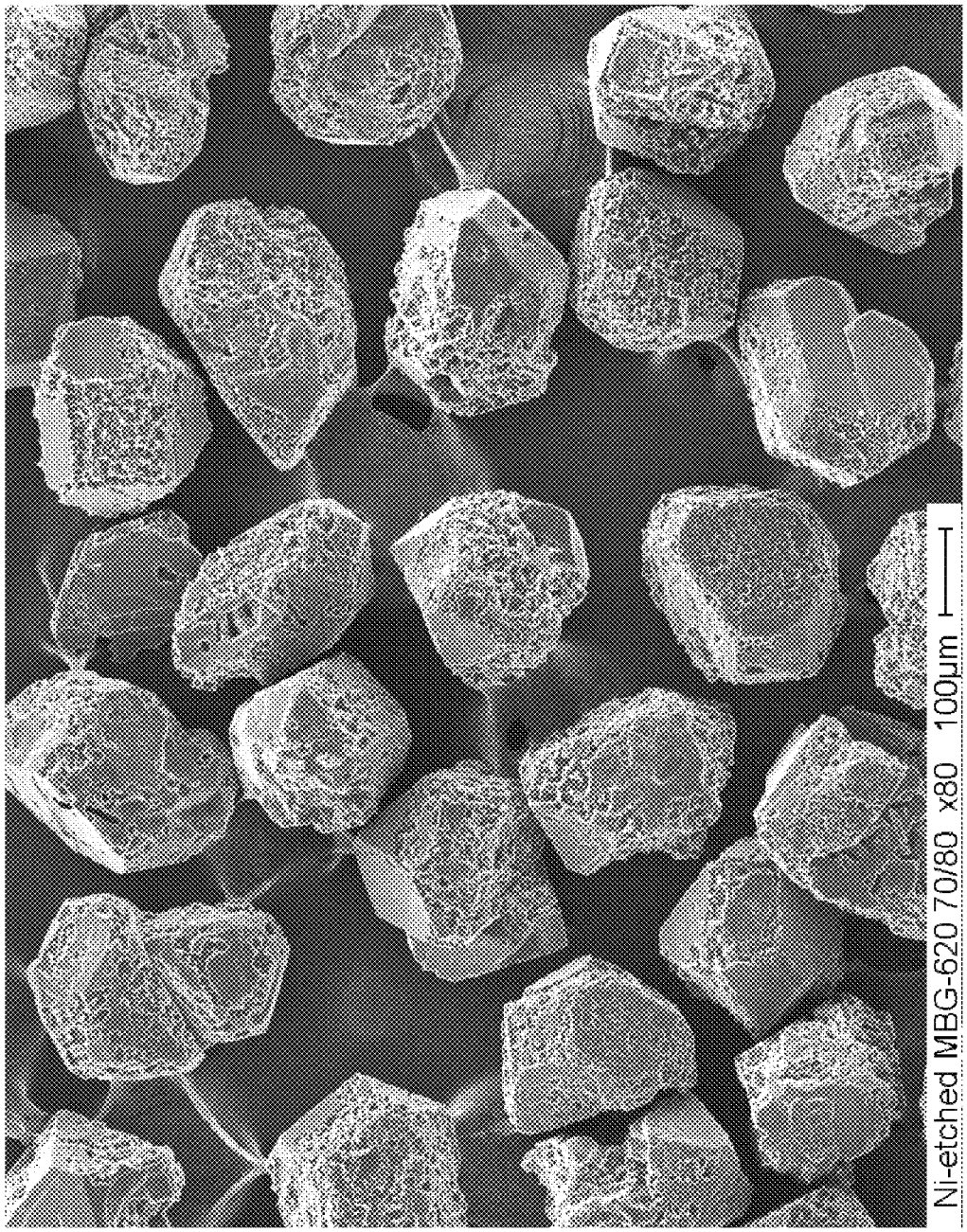
FIGS. 27A and 27B are SEM images of diamond particles of an embodiment.
Figure 27B:
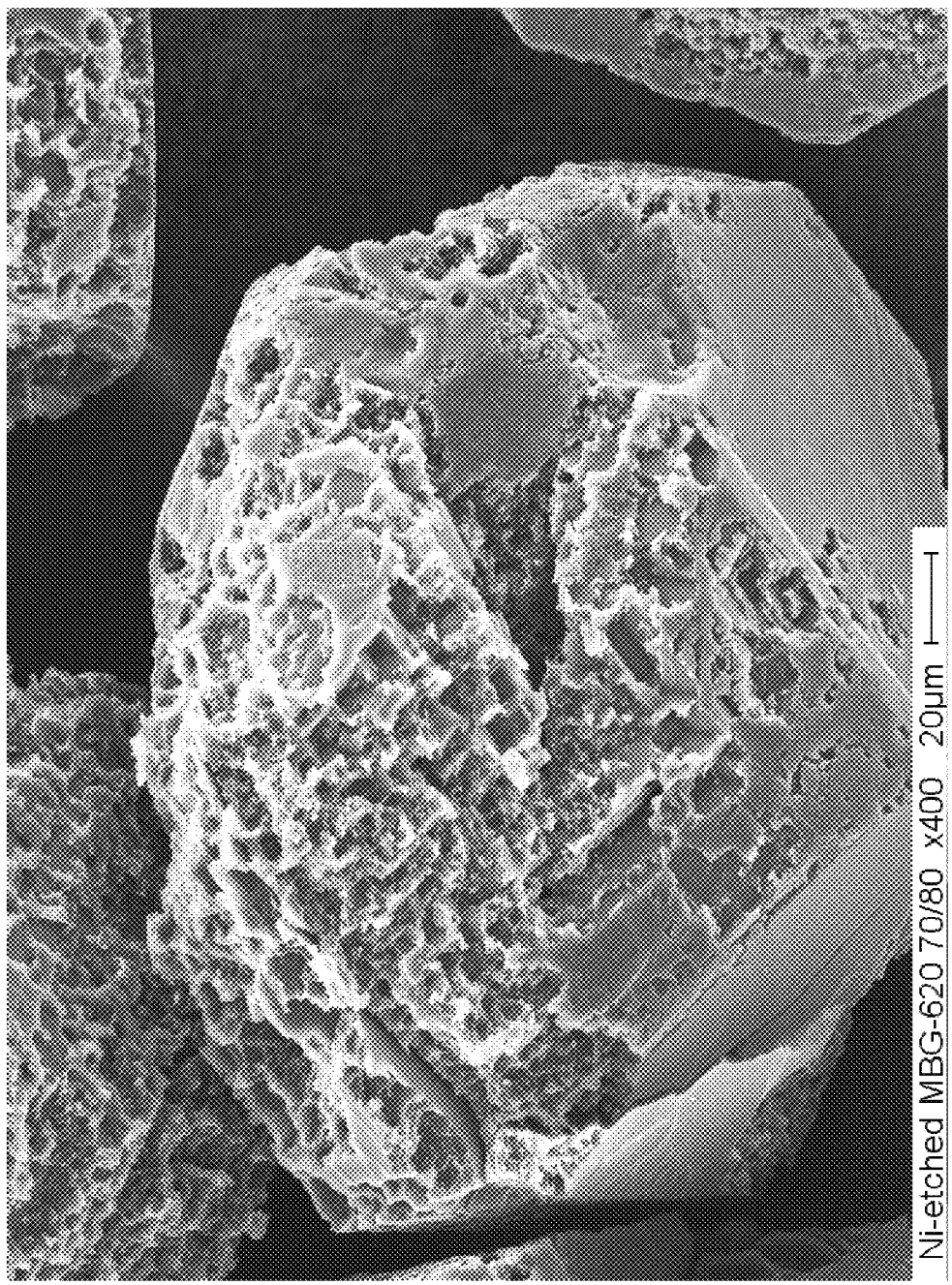

A 14% diamond weight loss has been achieved with this experiment. Samples of the particles are shown in FIGS. 27A and 27B.

EXAMPLE III

The diamond powders of Example 1 were additionally evaluated in a sapphire lapping application. Ethylene glycol-based slurries were made using the monocrystalline modified diamond particles ("Nickel Coating Modified Diamond") and, from the same lot, conventional monocrystalline diamond particles "(Unmodified Diamond") from which the nickel coating modified diamond was made. Slurries were also made from iron powder modified diamond as described in Example 1 as well as from conventional polycrystalline diamond. The slurries were used for flat-lapping sapphire wafers. The lapping plate was a composite copper/resin material (Lapmaster Inc.) and the sapphire wafers were c-plane, 2 inches diameter, as-lapped surface texture and 490 μm thick. The lapping process was performed using each of the slurries under the same processing conditions and for the same amount of time. The diamond concentration in each of the slurries was 10 carats per 500 ml and the viscosity was 15-20 cps. Before each test, the lapping plate was dressed for 5 minutes using a 600 grit diamond dressing wheel. The pressure on each of the sapphire wafers was 3.2 psi, rotational speed of the lapping plate was 60 rpm and the slurry feed rate was 2-3 ml per minute. After each cycle, the wafers were measured for weight loss.

Figure 5:
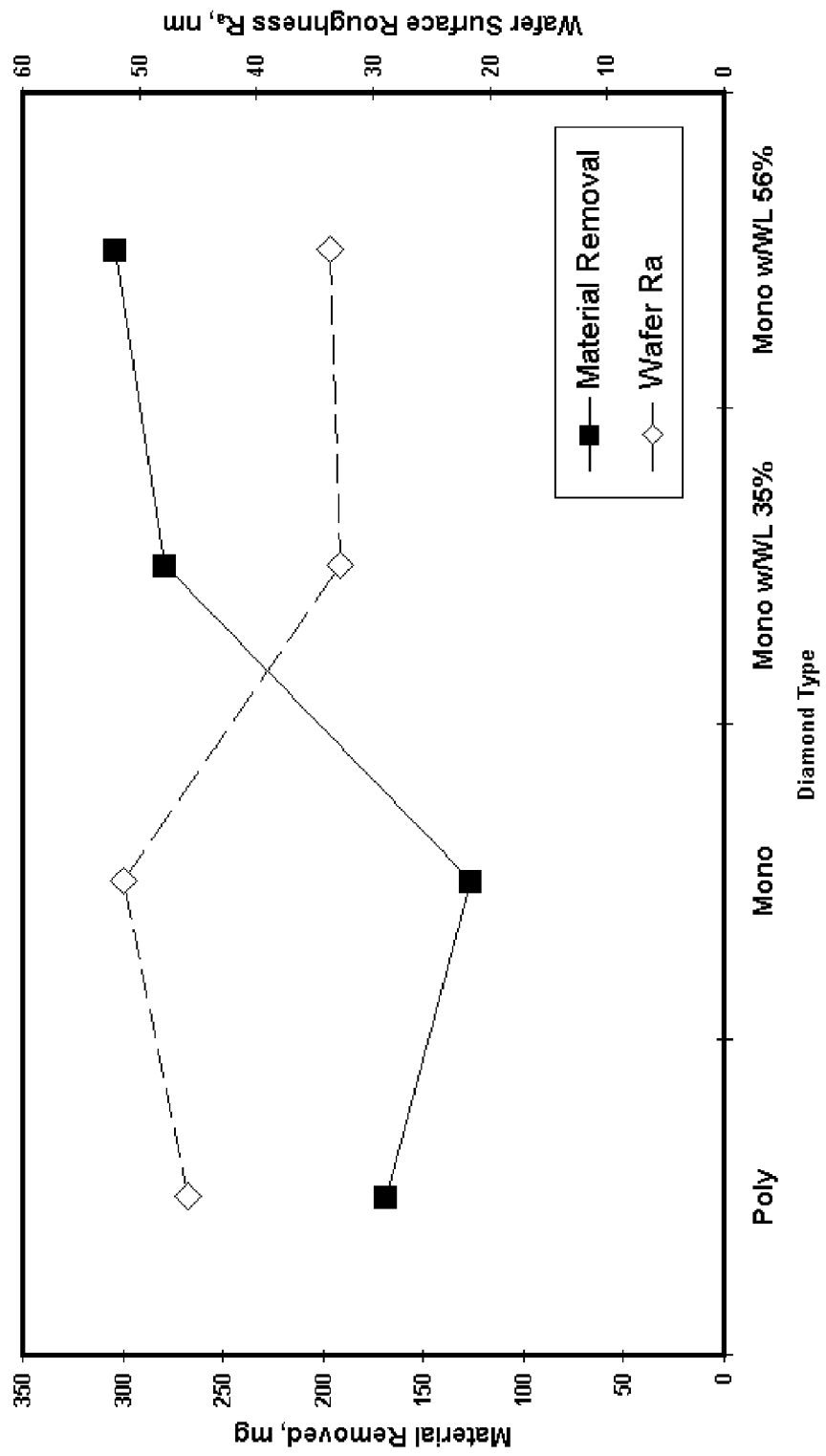
FIG. 5 is a graph showing the material removal rate and resulting surface finish of sapphire wafers from a lapping process using slurries made from various diamond powders including modified diamond powder using a nickel coating process.

FIG. 5 is a graph comparing the lapping performance of conventional 4-8 micron monocrystalline diamond particles in a slurry with 10 carats of diamond in 500 ml slurry, conventional 4-8 micron polycrystalline diamond particles in a slurry with 10 carats of diamond in 500 ml slurry and two slurries using modified 4-8 micron monocrystalline diamond particles of 35 percent weight loss and 56 percent weight loss using 10 carats of diamond per 500 ml of slurry. As can be seen from FIG. 5 and in FIG. 2 (Table 1), the material removal rate of the conventional 4-8 μm diamond slurry is 126 mg per hour per sapphire wafer. Using the slurry made with the polycrystalline diamond particles, the material removal rate was 168 mg/hr. The slurries made using the modified diamond particles resulted in material removal rates of 279 mg/hr for the 35 percent weight loss powder and 304 mg/hr using the 56 percent weight loss powder.

It can also be seen from the results shown in FIG. 5 that, although the modified diamond particles provide significantly higher material removal rates, the resulting roughness ($R_a$) of the surface of the sapphire wafers are lower than with the conventional monocrystalline diamond and with the polycrystalline diamond. The wafer roughness of wafers polished with the polycrystalline diamond slurry was 45.9 nm+/−3.5 nm and the wafer roughness of wafers polished with the monocrystalline diamond was 51.3 nm+/−2.7 nm. By comparison, the wafer roughness of the sapphire wafers polished using the 35 percent weight loss diamond was 32.8 nm+/−1.8 nm and wafers polished with the 56 percent weight loss diamond slurry had a wafer roughness of 33.7 nm+/−2.7 nm as measured by a Veeco Wyco Model NT1100 Optical Surface Profilometer.

As shown in FIG. 2 (Table 1) it can be seen that the specific surface areas of the monocrystalline modified diamond particles are 1.29 $m^2$/gram and 1.55 $m^2$/gram for a 35 percent and 56 percent weight loss diamond respectively. This compares to a specific surface area of 0.88 $m^2$/gram or a 47% and 76% increase. This is significant because the particle size distributions of the two samples are the same. The increased surface area is due to the creation of additional area on the surface of the modified monocrystalline diamond particles.

EXAMPLE IV

A 6-12 µm monocrystalline diamond powder with a mean size of 9 µm was blended with an iron powder with a mean size of 3 µm using a blend ratio of 30 weight percent diamond particles and 70 weight percent iron powder (no binder). The blend was compacted into a 2 cm×0.5 cm pellet using a Carver press at a pressure of 20,000 psi. The pellet was heated at 700° C. for 2 hours in a hydrogen atmosphere. The diamond particles were recovered using an acid digestion process. Characteristics of the diamond particles of this sample are shown in FIG. 13 (Table 2).

Ethylene glycol-based slurries were made using the monocrystalline diamond particles of the present invention ("Modified Diamond") and, from the same lot, conventional monocrystalline diamond particles "(Unmodified Diamond") from which the modified diamond was made. The slurries were used for flat-lapping sapphire wafers. The lapping plate was a composite copper plate and the sapphire wafers were 2 inches in diameter. The lapping process was performed using each slurry under the same processing conditions and for the same amount of time. The slurry diamond concentration was 10 carats per 500 ml and the viscosity was 15-20 cps. Before each test, the lapping plate was dressed for 5 minutes using a 600 grit diamond dressing wheel. The pressure on each of the sapphire wafers was 3.2 psi, rotational speed of the lapping plate was 60 rpm and the slurry feed rate was 2-3 ml per minute. After each cycle, the wafers were measured for weight loss.

Figure 22:
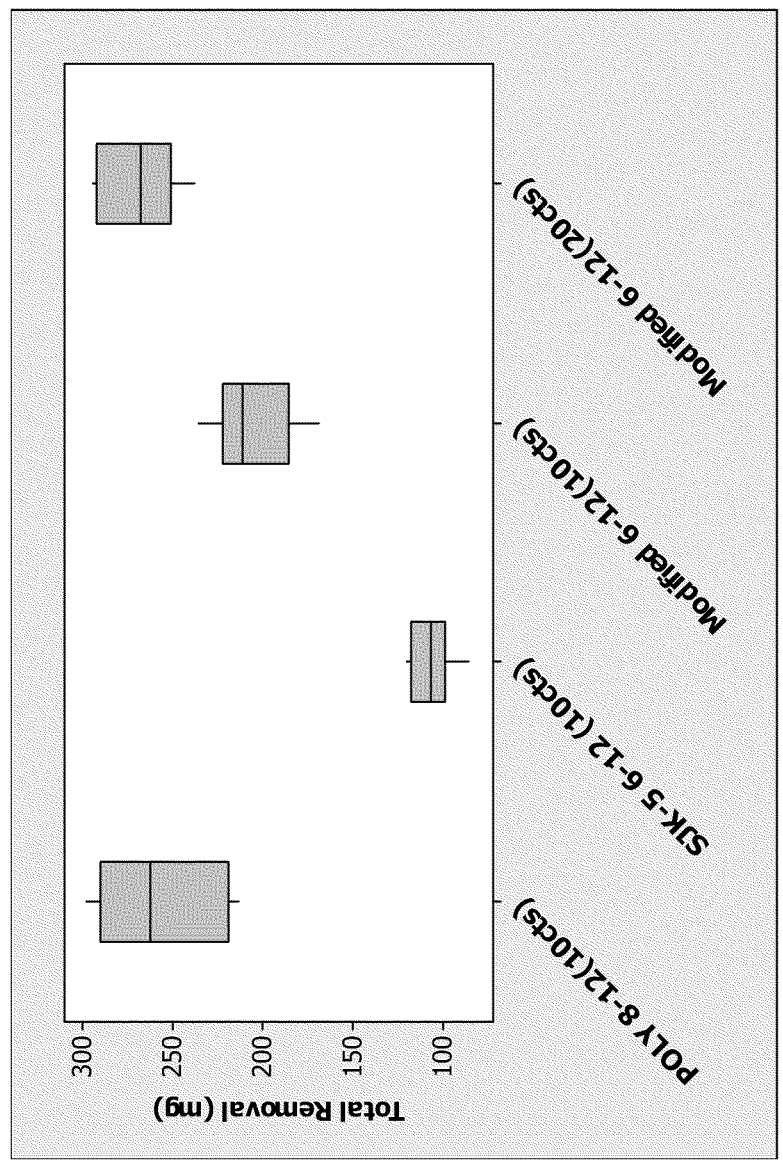
FIG. 22 is a graph comparing the lapping performance of conventional monocrystalline diamond particles, conventional polycrystalline diamond particles and the monocrystalline diamond particles of an embodiment.

FIG. 22 is a graph comparing the lapping performance of conventional 6-12 micron monocrystalline diamond particles in a slurry with 10 carats of diamond in 500 ml slurry, conventional 8-12 micron polycrystalline diamond particles in a slurry with 10 carats of diamond in 500 ml slurry and 6-12 micron monocrystalline modified diamond particles (Modified 6-12) in slurries using 10 carats of diamond of the present invention per 500 ml of slurry and a slurry using 20 carats of diamond of the present invention per 500 ml of slurry.

It has been shown that the increase in specific surface areas of the monocrystalline diamond particles of the present invention ("Modified Diamond") compared to the conventional monocrystalline diamond particles ("Unmodified Diamond") is 0.64 $m^2$/gram vs. 0.50 $m^2$/gram or a 28% increase. This is significant because the particle size distributions of the two samples are the same. The increased surface area is due to the creation of additional area on the surface of the monocrystalline diamond particles of the present invention.

EXAMPLE V

A series of seven additional experiments were performed whereby samples of 9 µm conventional monocrystalline diamond particles and iron powder were pressed into pellets (according to Example III) using various times and temperatures, as indicated in FIG. 23, Table 3.

The diamonds were processed and recovered as described in Example IV. Measurements of weight loss, surface roughness and sphericity were obtained from the samples recovered from these experiments. Additionally, slurries were made from each of the samples and tested in the lapping test also described in Example IV.

For each sample, images of the modified diamond particles were taken with a Hitachi model S-2600N Scanning Electron Microscope (SEM) at a 2500× magnification. The SEM images were saved as TIFF image files which were then loaded into a Clemex image analyzer Vision PE 3.5 that was calibrated to the same magnification (2500×). In this example and for this magnification, the calibration resulted in 0.0446 µm/pixel resolution. The image analysis system measured particle size and shape parameters on a particle by particle basis. Measurements for a population of at least 50 particles from each set of experiments were generated automatically by the Clemex image analyzer. Mathematical formulas used by the image analyzer device to derive the measurements are found in the "Definitions" section above and can also be found in the Clemex Vision User's Guide PE 3.5 ©2001. Surface roughness and sphericity were calculated and are reported in FIG. 13 (Table 2) in addition to weight loss and specific surface area for each test. Results from Example IV are also included in FIG. 13 (Table 2).

EQUIVALENTS

Although the invention has been described in connection with certain exemplary embodiments, it will be evident to those of ordinary skill in the art that many alternatives, modifications, and variations may be made to the disclosed invention in a manner consistent with the detailed description provided above. Also, it will be apparent to those of ordinary skill in the art that certain aspects of the various disclosed example embodiments could be used in combination with aspects of any of the other disclosed embodiments or their alternatives to produce additional, but not herein explicitly described, embodiments incorporating the claimed invention but more closely adapted for an intended use or performance requirements. Accordingly, it is intended that all such alternatives, modifications and variations that fall within the spirit of the invention are encompassed within the scope of the appended claims.

The invention claimed is:

1. A method for producing modified diamond particles, comprising the steps of:
   a) providing a plurality of diamond particles;
   b) providing a reactive, uniform metal coating on said abrasive diamond particles directly;

c) heating said coated abrasive particles diamond particles;
d) converting diamond particles partly to graphite while forming pits and spikes on the diamond particles;
e) recovering modified abrasive particles diamond particles by removing the graphite and the reactive, uniform coating;
and f) reducing diamond weight by more than 10%, wherein said modified abrasive diamond particles have a surface roughness that is less than about 0.95.

2. The method of claim 1 wherein said diamond particles are monocrystalline diamond particles.

3. The method of claim 1, wherein said metal coating comprises nickel.

4. The method of claim 1, wherein said heating comprises heating said metal coated particles to a temperature of at least about 700° C.

5. The method of claim 1, wherein the percentage of metal coating to abrasive particles is about 10 wt % to about 90 wt %.

6. The method of claim 1, wherein said modified abrasive particles have an average weight loss of more than about 20% of the original weight of the particle.

\* \* \* \* \*